US009024449B2

(12) United States Patent
Okumoto et al.

(10) Patent No.: US 9,024,449 B2
(45) Date of Patent: *May 5, 2015

(54) THIN-FILM TRANSISTOR ELEMENT AND METHOD FOR PRODUCING SAME, ORGANIC EL DISPLAY ELEMENT AND METHOD FOR PRODUCING SAME, AND ORGANIC EL DISPLAY DEVICE

(71) Applicant: Panasonic Corporation, Osaka (JP)

(72) Inventors: Yuko Okumoto, Osaka (JP); Akihito Miyamoto, Osaka (JP); Takaaki Ukeda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/059,559

(22) Filed: Oct. 22, 2013

(65) Prior Publication Data

US 2014/0042417 A1     Feb. 13, 2014

Related U.S. Application Data

(63) Continuation of application No. PCT/JP2011/003549, filed on Jun. 21, 2011.

(51) Int. Cl.
*H01L 29/40*     (2006.01)
*H01L 21/4763*     (2006.01)
(Continued)

(52) U.S. Cl.
CPC ............ *H01L 51/52* (2013.01); *H01L 27/1292* (2013.01); *H01L 27/3248* (2013.01); *H01L 51/0512* (2013.01); *H01L 51/56* (2013.01); *H01L 51/0558* (2013.01); *H01L 27/3274* (2013.01)

(58) Field of Classification Search
CPC ...................................................... H01L 51/525
USPC ............ 438/21, 668, 637–640; 257/623, 774, 257/E21.578, E21.585
See application file for complete search history.

(56) References Cited

U.S. PATENT DOCUMENTS 5,443,922 A     8/1995     Nishizaki et al.
7,772,622 B2     8/2010     Fujimori et al.
(Continued)

FOREIGN PATENT DOCUMENTS

JP     5-163488     6/1993
JP     2004-335851     11/2004
(Continued)

OTHER PUBLICATIONS

United States office action, mailed Jun. 16, 2014, in U.S. Appl. No. 13/968,567.
(Continued)

*Primary Examiner* — Calvin Lee
(74) *Attorney, Agent, or Firm* — Greenblum & Bernstein, P.L.C.

(57) ABSTRACT

A thin film transistor element includes: a gate electrode; a source electrode and a drain electrode; an insulating layer; partition walls; and an organic semiconductor layer. The partition walls define a first aperture. Within the first aperture, at least a part of the source electrode and at least a part of the drain electrode are in contact with the semiconductor layer. The partition walls have side face portions facing the first aperture, and some of the side face portions have gentler slopes than the rest of the side face portions.

11 Claims, 15 Drawing Sheets

(51) Int. Cl.
*H01L 51/52* (2006.01)
*H01L 27/12* (2006.01)
*H01L 27/32* (2006.01)
*H01L 51/05* (2006.01)
*H01L 51/56* (2006.01)

(56) References Cited

U.S. PATENT DOCUMENTS

| | | | |
|---|---|---|---|
| 8,018,540 B2 * | 9/2011 | Shin et al. | 349/38 |
| 8,274,079 B2 * | 9/2012 | Yamazaki | 257/43 |
| 8,729,534 B2 | 5/2014 | Yoshida et al. | |
| 2007/0109457 A1 | 5/2007 | Song et al. | |
| 2007/0117298 A1 | 5/2007 | Fujimori et al. | |
| 2007/0166855 A1 | 7/2007 | Lee et al. | |
| 2009/0224664 A1 | 9/2009 | Yoshida et al. | |
| 2011/0014389 A1 | 1/2011 | Ito | |
| 2011/0254003 A1 | 10/2011 | Tsuzuki et al. | |
| 2013/0069059 A1 | 3/2013 | Yamazaki | |
| 2013/0328033 A1 * | 12/2013 | Okumoto et al. | 257/40 |
| 2013/0328034 A1 * | 12/2013 | Okumoto et al. | 257/40 |

FOREIGN PATENT DOCUMENTS

| | | |
|---|---|---|
| JP | 2007-88471 | 4/2007 |
| JP | 2007-142305 | 6/2007 |
| JP | 2008-227141 | 9/2008 |
| JP | 2008-288313 | 11/2008 |
| JP | 2009-76791 | 4/2009 |
| JP | 2009-272523 | 11/2009 |
| JP | 2010-93093 | 4/2010 |
| WO | 2008/149498 | 12/2008 |
| WO | 2010/058662 | 5/2010 |
| WO | 2011/132215 | 10/2011 |
| WO | 2012/035281 | 3/2012 |

OTHER PUBLICATIONS

Office Action in U.S. Appl. No. 13/968,571, dated Oct. 27, 2014.
Office Action in U.S. Appl. No. 13/968,549, dated Nov. 5, 2014.
Office Action (Notice of Allowance) in U.S. Appl. No. 13/968,559, dated Sep. 17, 2014.
Office Action in U.S. Appl. No. 13/968,556, dated Aug. 6, 2014.
International Search Report and Written Opinion of PCT/JP2011/003547, mailing date is Sep. 20, 2011, together with English translation of ISR.
International Search Report and Written Opinion of PCT/JP2012/005995, mailing date is Dec. 4, 2012, together with English translation of ISR.
International Search Report and Written Opinion of PCT/JP2012/005999, mailing date is Dec. 11, 2012, together with English translation of ISR.
International Search Report and Written Opinion of PCT/JP2012/006007, mailing date is Dec. 4, 2012, together with English translation of ISR.
International Search Report and Written Opinion of PCT/JP2012/006000, mailing date is Dec. 11, 2012, together with English translation of ISR.
International Search Report and Written Opinion of PCT/JP2011/003549, mailing date is Sep. 20, 2011, together with English translation of ISR.
International Search Report and Written Opinion of PCT/JP2012/005996, mailing date is Dec. 11, 2012, together with English translation of ISR.
U.S. Appl. No. 14/061,057 to Yuko Okumoto et al., filed Oct. 23, 2013.
U.S. Appl. No. 13/968,567 to Yuko Okumoto et al., filed Aug. 16, 2013.
U.S. Appl. No. 13/968,556 to Yuko Okumoto et al., filed Aug. 16, 2013.
U.S. Appl. No. 13/968,571 to Yuko Okumoto et al., filed Aug. 16, 2013.
U.S. Appl. No. 13/968,549 to Yuko Okumoto et al., filed Aug. 16, 2013.
U.S. Appl. No. 13/968,559 to Yuko Okumoto et al., filed Aug. 16, 2013.

* cited by examiner

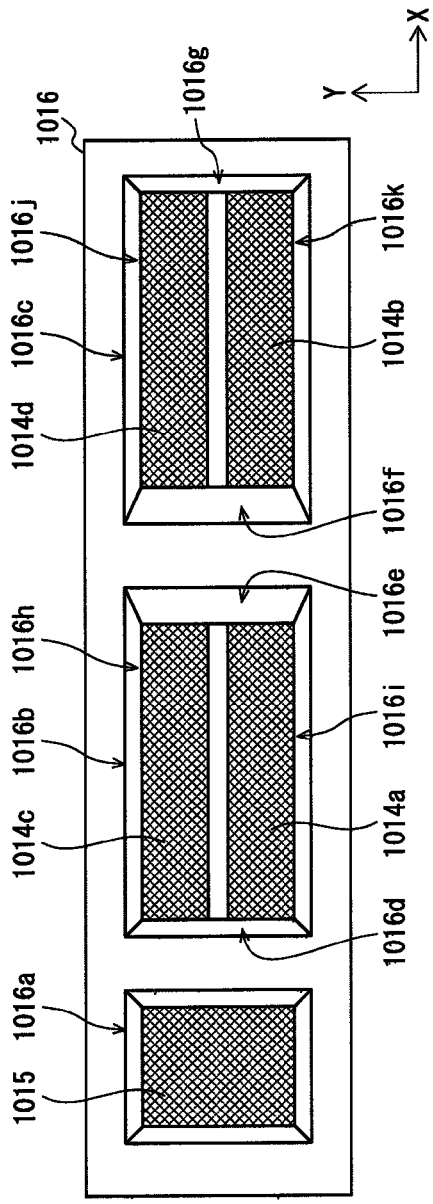
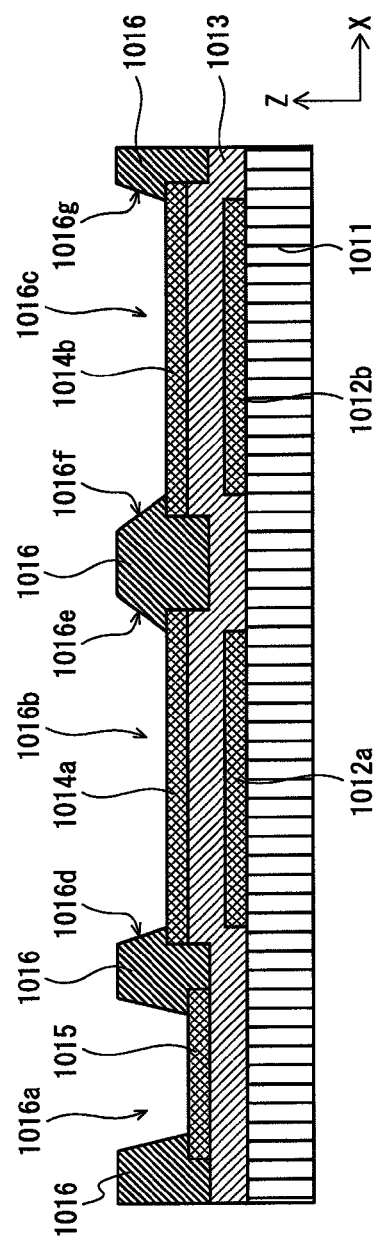
FIG. 3A
FIG. 3B

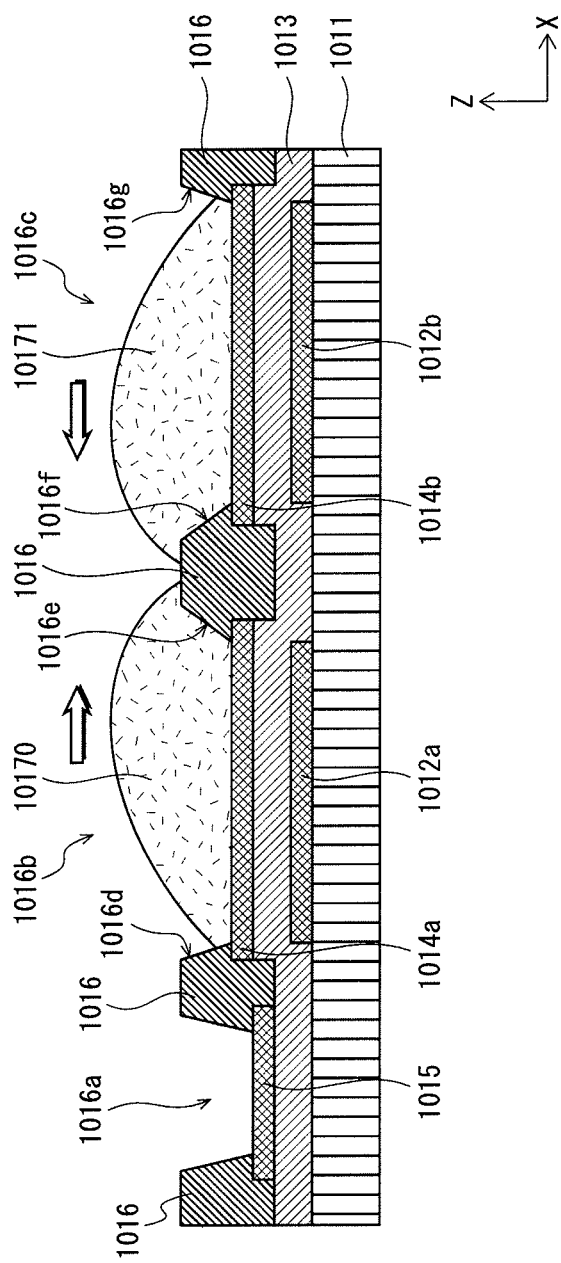

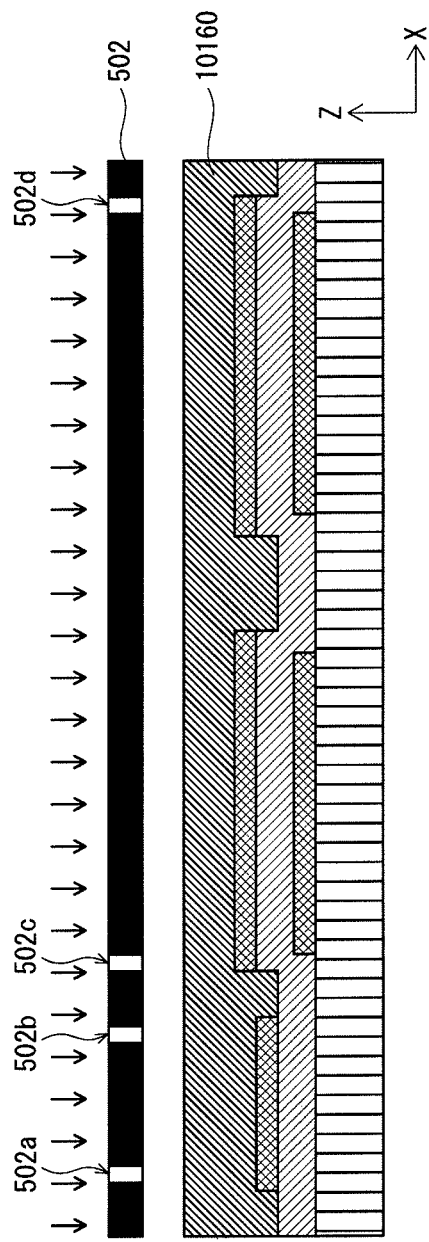
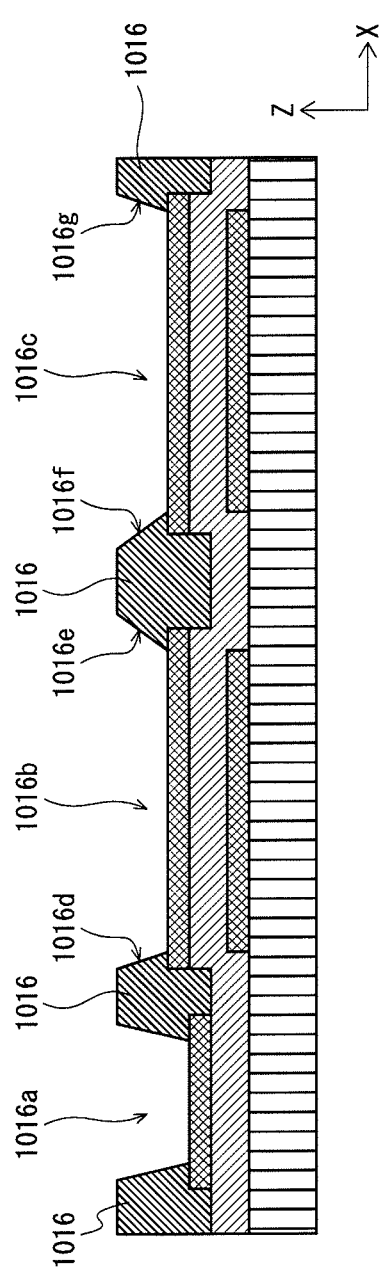
FIG. 7A
FIG. 7B

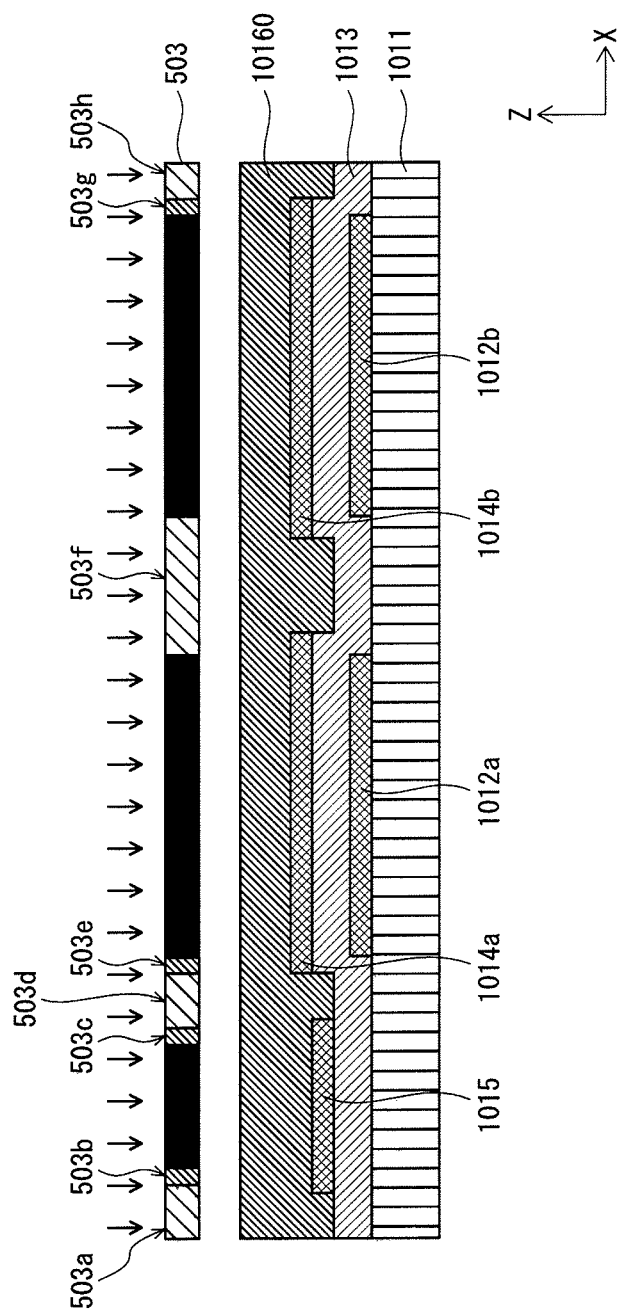

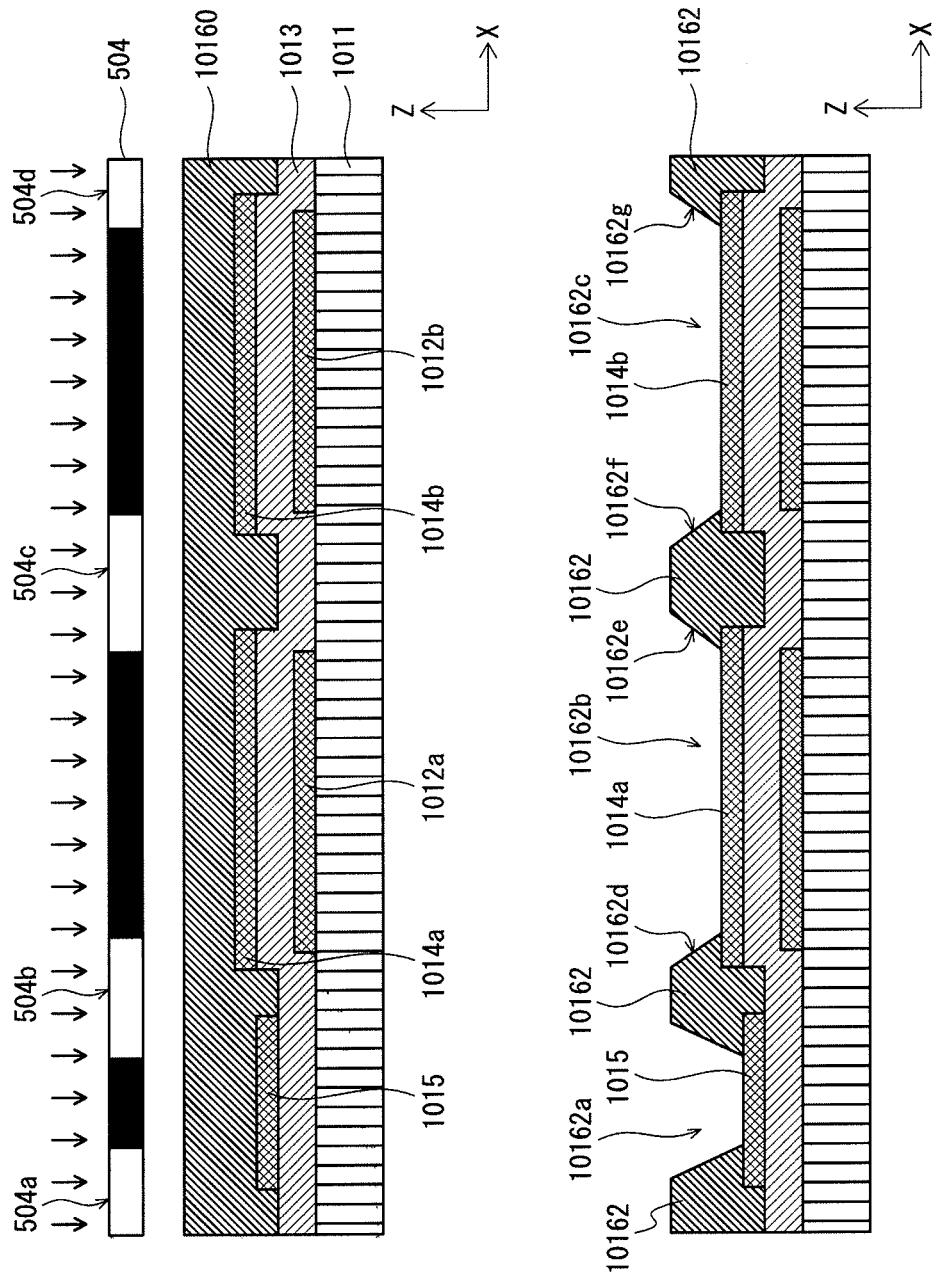

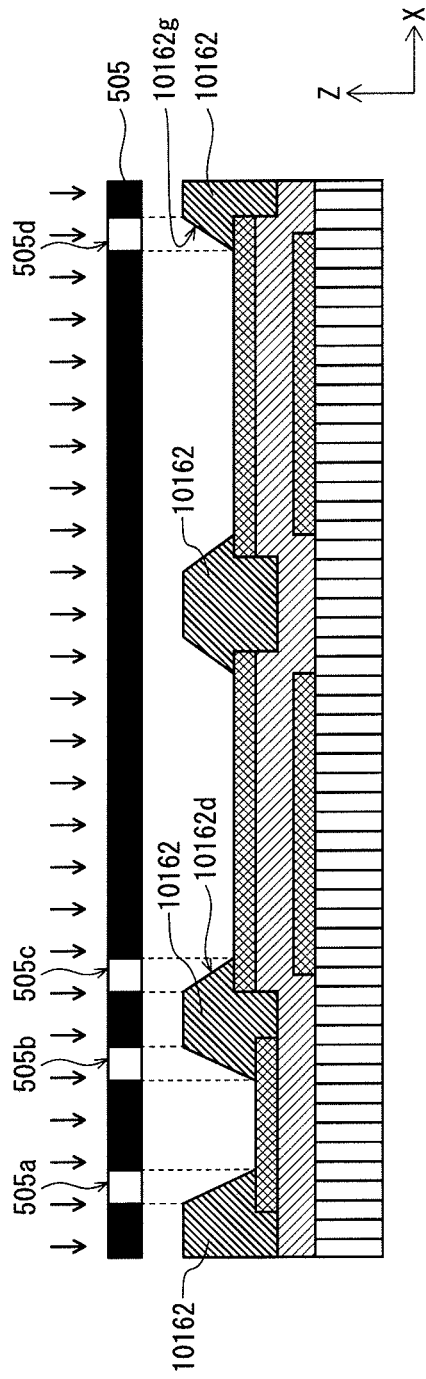
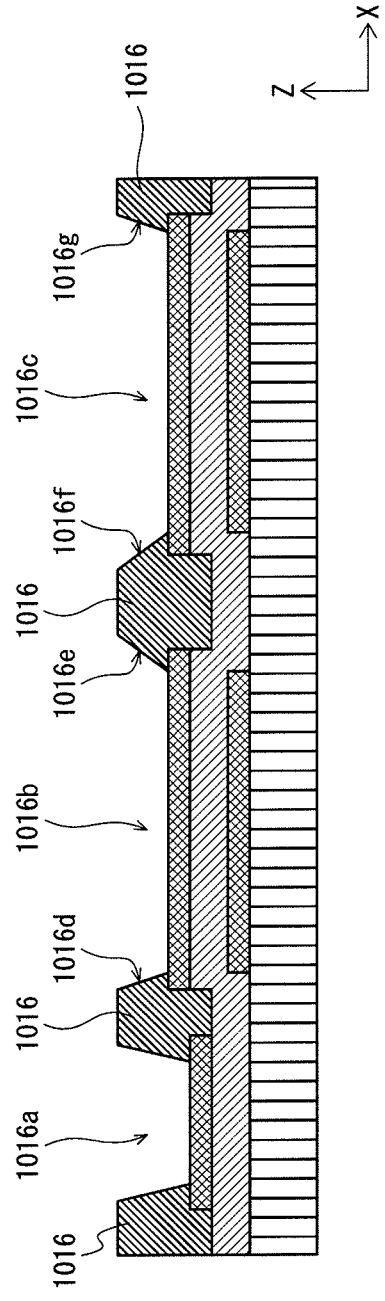
FIG. 10A
FIG. 10B

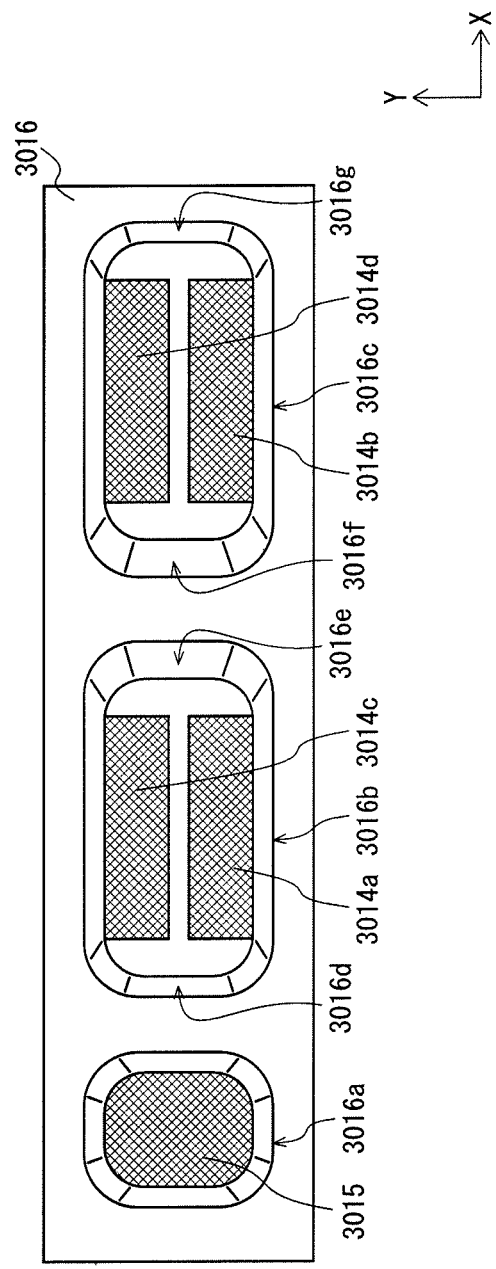

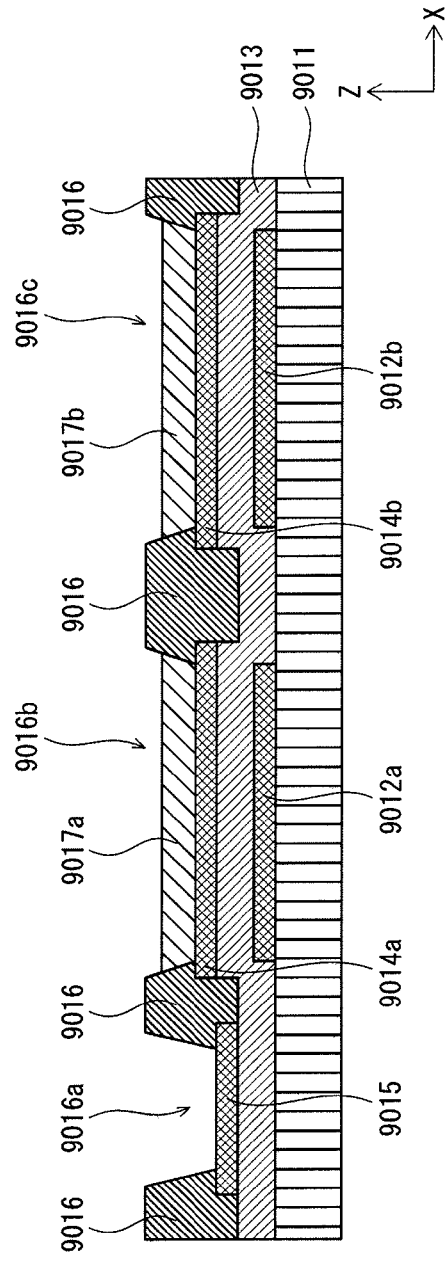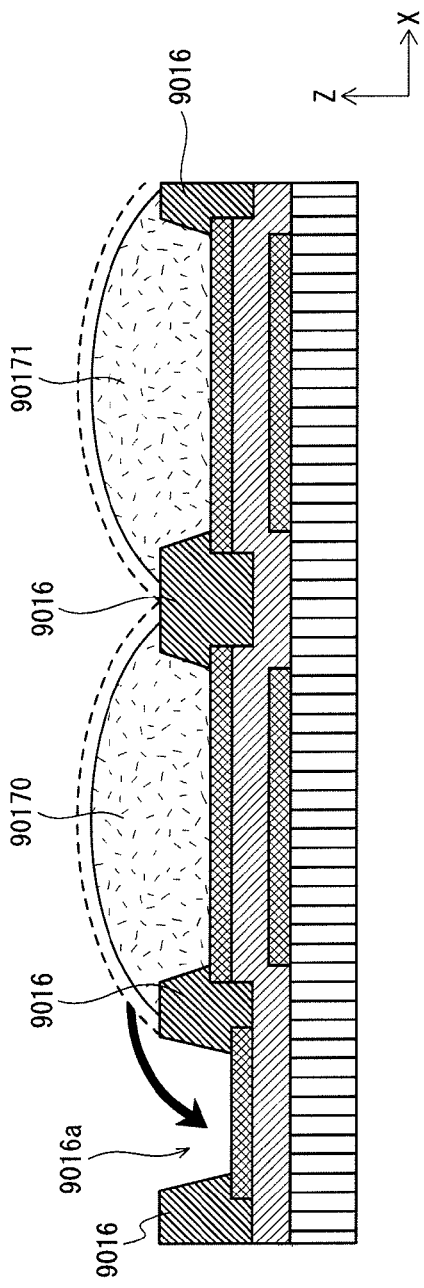
FIG. 15A Prior Art
FIG. 15B Prior Art

US 9,024,449 B2

THIN-FILM TRANSISTOR ELEMENT AND METHOD FOR PRODUCING SAME, ORGANIC EL DISPLAY ELEMENT AND METHOD FOR PRODUCING SAME, AND ORGANIC EL DISPLAY DEVICE

CROSS REFERENCE TO RELATED APPLICATION

This is a continuation application of PCT Application No. PCT/JP2011/003549 filed Jun. 21, 2011, designating the United States of America, the disclosure of which, including the specification, drawings and claims, is incorporated herein by reference in its entirety.

TECHNICAL FIELD

The present disclosure relates to a thin film transistor element and a manufacturing method thereof, an organic EL display element and a manufacturing method thereof, and an organic EL display device, and in particular to a structure of a thin film transistor element having an organic semiconductor film.

DESCRIPTION OF THE RELATED ART

In liquid crystal display panels and organic EL display panels, control of light emission is performed in units of subpixels. To make this possible, thin film transistor (TFT) elements are formed in liquid crystal display panels and organic EL display panels. In particular, development is in progress of thin film transistor elements including organic semiconductor layers.

As illustrated in FIG. 15A, a conventional TFT element includes, for instance: a substrate 9011; gate electrodes 9012a, 9012b; an insulating layer 9013; source electrodes 9014a, 9014b; drain electrodes (undepicted); and organic semiconductor layers 9017a, 9017b. The gate electrodes 9012a, 9012b, the insulating layer 9013, the source electrodes 9014a, 9014b, the drain electrodes, and the organic semiconductor layers 9017a, 9017b are formed by being layered one on top of another in the stated order on the substrate 9011. The organic semiconductor layers 9017a, 9017b are formed by applying organic semiconductor ink onto the insulating layer 9013 and by drying the applied organic semiconductor ink. The organic semiconductor layer 9017a is formed so as to fill the gap between the source electrode 9014a and the corresponding drain electrode and cover the source electrode 9014a and the corresponding drain electrode. Similarly, the organic semiconductor layer 9017b is formed so as to fill the gap between the source electrode 9014b and the corresponding drain electrode and cover the source electrode 9014b and the corresponding drain electrode.

In addition, as illustrated in FIG. 15A, partition walls 9016 are formed on the insulating layer 9013. The partition walls 9016 partition adjacent TFT elements from one another. The partition walls 9016 define a plurality of apertures, namely apertures 9016a through 9016c. The aperture 9016a has a bottom portion where a connection wire 9015 that is connected with a drain electrode remains exposed. Further, an organic semiconductor layer is not formed with respect to the aperture 9016a. The connection wire 9015 is an electrode to be connected to an electrode of a light-emitting element portion to be formed above the TFT element. On the other hand, the organic semiconductor layers 9017a, 9017b are formed with respect to the apertures 9016b, 9016c, respectively. Note that the organic semiconductor layers 9017a, 9017b are partitioned from one another.

As already discussed above, a TFT element is used in a liquid crystal display panel, an organic EL display panel, or the like, and controls light emission of a light-emitting element portion according to signals input to the gate electrodes 9012a, 9012b.

CITATION LIST

Patent Literature

[Patent Literature 1] Japanese Patent Application Publication No. 2009-76791

SUMMARY

Technical Problem

One problem in a conventional TFT element such as the one described above is the formation of an organic semiconductor layer with respect to an area of the TFT element where the formation of an organic semiconductor layer is undesirable (e.g., an inside of the aperture 9016a in the case illustrated in FIG. 15A). The formation of an organic semiconductor layer at such an area of the TFT element results in poor electrical connection between the TFT element and other elements (for instance, the above-described light-emitting element portion), and hence, is problematic. In specific, as illustrated in FIG. 15B, when respectively applying organic semiconductor ink portions 90170, 90171 with respect to the apertures 9016b, 9016c defined by the partition walls 9016, there are cases where the organic semiconductor ink portions 90170, 90171 overflows, flows out from the apertures 9016b, 9016c, and flows into the aperture 9016a. This results in the connection wire 9015, which is provided for electrical connection, being covered by an organic semiconductor layer.

It can be assumed that the above-described problem is likely to occur especially in a liquid crystal display panel, an organic EL display panel, etc. This is since there is a demand for realizing a liquid crystal display panel, an organic EL display panel, etc., with higher definition, which gives rise to a demand for downsizing subpixels therein. When the downsizing of subpixels is performed in response to such a demand, the distances between the above-described apertures are shortened, and the risk increases of ink overflowing from a given aperture and flowing into another aperture. As such, the above-described problem is likely to take place.

The present disclosure aims to solve the problem described above, and provides a thin film transistor element having high quality and a manufacturing method thereof, an organic EL display element and a manufacturing method thereof, and an organic EL display device. Such a high-quality thin film transistor element is realized by, upon formation of an organic semiconductor layer of the thin film transistor element, preventing formation of an organic semiconductor layer at an area where the formation of an organic semiconductor layer is undesirable.

Solution to Problem

A thin film transistor element pertaining to one aspect of the present invention has the following characteristics.

A thin film transistor element pertaining to one aspect of the present invention is a thin film transistor element comprising: a gate electrode; an insulating layer disposed on the gate electrode; a source electrode and a drain electrode disposed on the insulating layer with a gap therebetween; partition walls surrounding at least a part of the source electrode and at least a part of the drain electrode, the partition walls having liquid-repellant surfaces and defining a first aperture; and an organic semiconductor layer disposed on the source electrode and the drain electrode within the first aperture so as to cover the source electrode and the drain electrode and fill the gap between the source electrode and the drain electrode, the organic semiconductor layer being in contact with the source electrode and the drain electrode, wherein the partition walls have side face portions facing the first aperture, and some of the side face portions have gentler slopes than the rest of the side face portions.

Advantageous Effects

According to a thin film transistor element pertaining to one aspect of the present invention, some of the side face portions of the partition walls partitioning the organic semiconductor layer have gentler slopes than the rest of the side face portions. Therefore, in the process of applying organic semiconductor ink included in the manufacturing of the organic semiconductor layer, the ink is surely prevented from overflowing into the area where the formation of the organic semiconductor layer is undesirable, among the areas adjacent to the first aperture. As a result, the thin film pertaining to one aspect of the present invention has high quality.

BRIEF DESCRIPTION OF DRAWINGS

FIG. 3A is a schematic plan view illustrating a partial structure of a TFT substrate 101, and FIG. 3B is a schematic cross-sectional view illustrating a partial structure of the TFT substrate 101.

FIG. 5 is a schematic cross-sectional view showing the TFT substrate 101 that has been applied with organic semiconductor ink in the manufacturing of the TFT substrate 101.

FIGS. 7A and 7B are schematic process diagrams illustrating procedures relating to the formation of the partition walls 1016 among procedures involved in the manufacturing of the TFT substrate 101.

FIG. 8 is a schematic process diagram illustrating a procedure relating to the formation of the partition walls 1016 of the TFT substrate 101 among procedures involved in the manufacturing of an organic EL display panel pertaining to embodiment 2.

FIGS. 9A and 9B are schematic process diagrams illustrating some procedures relating to the formation of the partition walls 1016 of the TFT substrate 101 among procedures involved in the manufacturing of an organic EL display panel pertaining to embodiment 3.

FIGS. 10A and 10B are schematic process diagrams illustrating some procedures relating to the formation of the partition walls 1016 of the TFT substrate 101 among procedures involved in the manufacturing of the organic EL display panel pertaining to embodiment 3.

FIG. 11 is a schematic plan view illustrating, in a structure of an organic EL display panel pertaining to embodiment 4, a partial structure of partition walls 3016 of a TFT substrate.

FIG. 15A is a cross-sectional view illustrating, in a structure of an organic EL display device pertaining to conventional technology, a partial structure of a TFT substrate, and FIG. 15B is a cross-sectional view illustrating a procedure pertaining to application of organic semiconductor ink among procedures involved in the manufacturing of the TFT substrate pertaining to conventional technology.

DETAILED DESCRIPTION

[Overview of Aspects of Present Invention]

Figure 1:
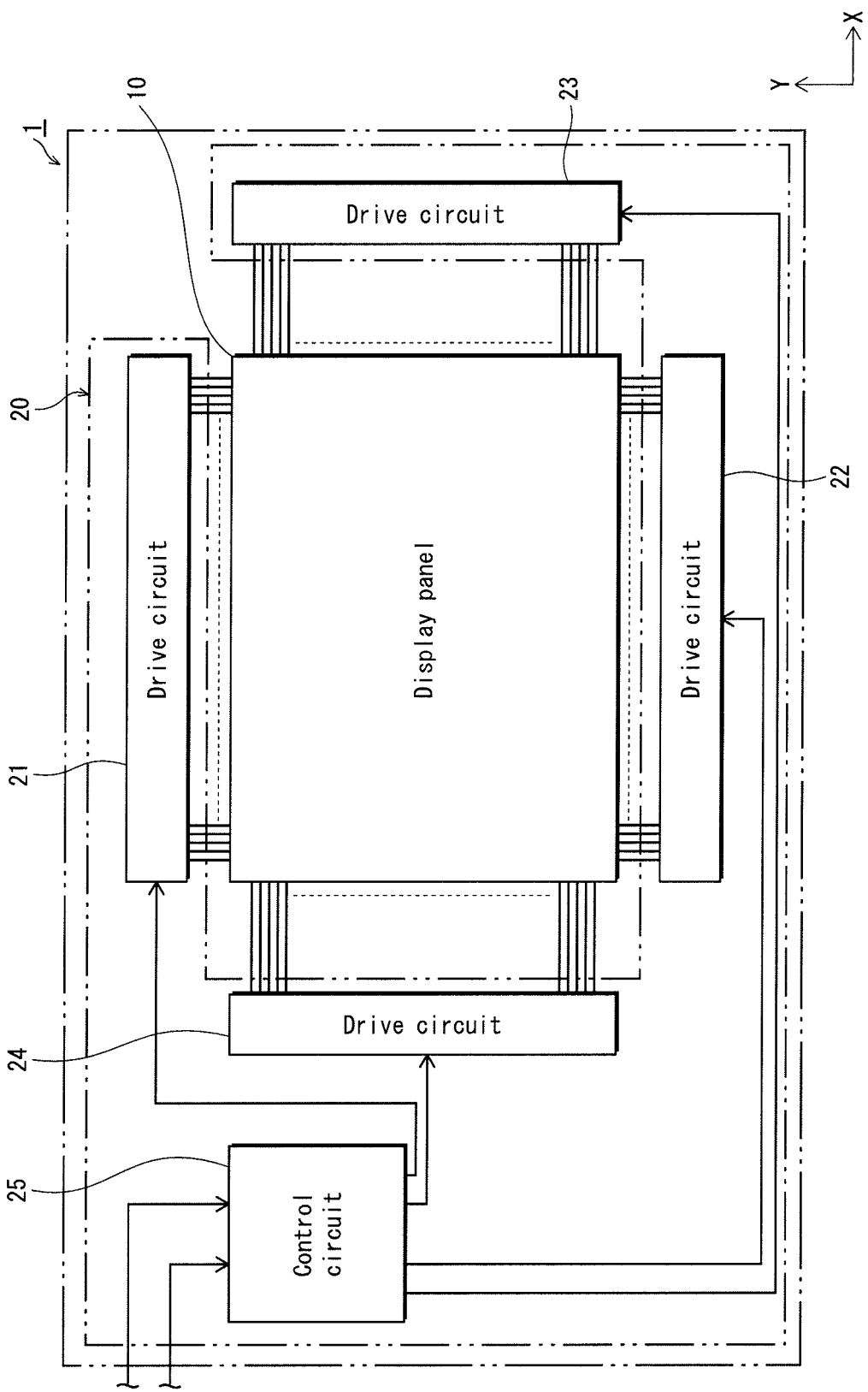
FIG. 1 is a schematic block diagram illustrating an overall structure of an organic EL display device 1 pertaining to embodiment 1.

One aspect of the present invention provides a thin film transistor element comprising: a gate electrode; an insulating layer disposed on the gate electrode; a source electrode and a drain electrode disposed on the insulating layer with a gap therebetween; partition walls surrounding at least a part of the source electrode and at least a part of the drain electrode, the partition walls having liquid-repellant surfaces and defining a first aperture; and an organic semiconductor layer disposed on the source electrode and the drain electrode within the first aperture so as to cover the source electrode and the drain electrode and fill the gap between the source electrode and the drain electrode, the organic semiconductor layer being in contact with the source electrode and the drain electrode, wherein the partition walls have side face portions facing the first aperture, and some of the side face portions have gentler slopes than the rest of the side face portions. Note that the side face portions having the gentler slopes are hereinafter referred to as "the gentle-slope side face portions".

According to a thin film transistor element pertaining to one aspect of the present invention, some of the side face portions of the partition walls partitioning the organic semiconductor layer are gentle-slope side face portions having gentler slopes than the rest of the side face portions. Therefore, in the process of applying organic semiconductor ink included in the manufacturing of the organic semiconductor layer, the ink is surely prevented from overflowing into the area where the formation of the organic semiconductor layer is undesirable, among the areas adjacent to the first aperture. As a result, the thin film pertaining to one aspect of the present invention has high quality.

Here, when some of the side face portions facing the first aperture and the rest of the side face portions have slopes with different inclinations as with the thin film transistor element pertaining to one aspect of the present invention, the surface of the organic semiconductor ink applied for the formation of the organic semiconductor layer is biased toward the gentle-slope side face portions. This is due to the relationship between the contact angle of the side face portions with the ink and the tensions of the ink surfaces.

That is, it is possible to control the shape of the surface of the ink by forming the steep-slope side face portions as the side face portions adjacent to the area where is to be protected from the overflow of ink, and forming the gentle-slope side face portions as the side face portions adjacent to the area where does not cause a problem even if the ink overflows into it. Thus, the ink is surely prevented from overflowing into the area where is to be protected from the overflow of the ink. Therefore, as described above, in the thin film transistor element pertaining to one aspect of the present invention, the ink is surely prevented from overflowing into the area where the formation of the organic semiconductor layer is undesirable. As a result, the thin film pertaining to one aspect of the present invention has high quality.

In the thin film transistor element pertaining to one aspect of the present invention, the first aperture with the organic semiconductor layer formed inside the first aperture functions as a channel portion, the partition walls define a second aperture with a gap between the first aperture and the second aperture, the second aperture not functioning as a channel portion, and among the side face portions facing the first aperture, said some of the side face portions having the gentler slopes do not include a side face portion that is adjacent to the second aperture.

When the first aperture serving as a channel portion and the second aperture not serving as a channel portion are adjacent to each other, the organic semiconductor layer is not formed in the second aperture. If this is the case, by forming the steep-slope side face portions as the side face portions adjacent to the second aperture and forming the gentle-slope side face portions as the other side face portions, the ink is surely prevented from overflowing into the second aperture in the process of applying the organic semiconductor ink to the first aperture for constituting the channel portion. As a result, the thin film transistor element has high quality.

In the thin film transistor element pertaining to one aspect of the present invention, among the side face portions facing the first aperture, said some of the side face portions having the gentler slopes are located opposite the side face portion that is adjacent to the second aperture with respect to the first aperture.

As described above, by forming the steep-slope side face portions as the side face portions adjacent to the second aperture and forming the gentle-slope side face portions as the opposite side face portions, the ink applied to the first aperture for constituting the channel portion during the process of forming the organic semiconductor layer is biased in the opposite direction from the second aperture. Therefore, the ink is prevented from overflowing into the second aperture. As a result, the thin film transistor element has high quality.

In the thin film transistor element pertaining to one aspect of the present invention, at least a part of the source electrode, at least a part of the drain electrode, or a connection wire electrically connected with the source electrode or the drain electrode is formed at a bottom of the second aperture.

When at least a part of the source electrode, at least a part of the drain electrode, or a connection wire electrically connected with the source electrode and the drain electrode is formed within the second aperture (i.e., when the second aperture functions as a contact portion) as described above, it is necessary to prevent the upper surface of the electrodes from being covered with the organic semiconductor layer. The above-described difference in inclination of the side face portions fulfills this objective.

In the thin film transistor element pertaining to one aspect of the present invention, among the side face portions facing the first aperture, the side face portion that is adjacent to the second aperture has the steepest slope.

As described above, it is not essential that the side face portions facing the first aperture are composed of side face portions with two different inclinations angles namely the steep-slope side face portions and the gentle-slope side face portions. That is, the side face portions may have three or more different inclination angles. Also in this case, it is preferable that the side face portions adjacent to the second aperture have the steepest slopes.

In the thin film transistor element pertaining to one aspect of the present invention, an inclination of each of the side face portions is defined as an angle thereof with respect to an upper surface of an underlayer on which the partition walls are formed.

In the thin film transistor element pertaining to one aspect of the present invention, inclination angles of the gentler slopes of said some of the side face portions are smaller than inclination angles of the rest of the side face portions by 5 degrees or more.

In the above-stated structures, it is preferable that the inclination angle of the "gentle-slope side face portions" is within the range of 25 degrees to 30 degrees. In the above-stated structures, it is preferable that the inclination angle of the "steep-slope side face portions" is within the range of 35 degrees to 40 degrees.

An organic EL display element pertaining to one aspect of the present invention is an organic EL display element comprising: the thin film transistor element pertaining to one aspect of the present invention; a planarizing film formed above the thin film transistor element and having a contact hole formed therein; a lower electrode formed on the planarizing film so as to cover the planarizing film and a side surface of the planarizing film defining the contact hole, and electrically connected with one of the source electrode and the drain electrode; an upper electrode formed above the lower electrode; and an organic light-emitting layer interposed between the lower electrode and the upper electrode.

As described above, the organic EL display element pertaining to one aspect of the present invention includes the thin film transistor element pertaining to one aspect of the present invention. Therefore, the organic EL display element achieves the same advantageous effects as with the above, and has high light-emission quality.

An organic EL display element pertaining to one aspect of the present invention is an organic EL display element comprising: the thin film transistor element pertaining to one aspect of the present invention; a planarizing film formed above the thin film transistor element and having a contact hole formed therein; a lower electrode formed on the planarizing film so as to cover the planarizing film and a side surface of the planarizing film defining the contact hole, and electrically connected with one of the source electrode and the drain electrode; an upper electrode formed above the lower electrode; and an organic light-emitting layer interposed between the lower electrode and the upper electrode, wherein a bottom of the contact hole is in communication with the second aperture.

When the second aperture functions as a contact area for the connection between the lower electrode and the thin film transistor element as described above, the organic semiconductor layer is surely prevented from being formed on the electrodes, and the organic EL display element achieves high light-emission quality.

One aspect of the present invention provides an organic EL display device comprising the organic EL display element pertaining to one aspect of the present invention.

As described above, since the organic EL display device pertaining to one aspect of the present invention has an organic EL display device pertaining to one aspect of the present invention, the organic EL display device achieves high light-emission quality for the same reasons as described above.

One aspect of the present invention is a method of manufacturing a thin film transistor element, including the first step through the sixth step as follows.

(i) First step: forming a gate electrode on a substrate.

(ii) Second step: forming an insulating layer on the gate electrode;

(iii) Third step: forming a source electrode and a drain electrode on the insulating layer so as to be adjacent to each other with a gap therebetween.

(iv) Fourth step: depositing a layer of photosensitive resist material such that, above the insulating layer, the layer of photosensitive resist material covers the source electrode and the drain electrode as well as areas therearound.

(v) Fifth step: forming partition walls on the insulating layer by performing mask exposure and patterning of the layer of photosensitive resist material, the partition walls having liquid-repellant surfaces and defining a first aperture, the first aperture surrounding at least a part of the source electrode and at least a part of the drain electrode.

(vi) Sixth step: forming an organic semiconductor layer so as to be in contact with the source electrode and the drain electrode by applying organic semiconductor material within the first aperture and drying the organic semiconductor material so applied.

In the fifth step, the partition walls are formed such that the partition walls have side face portions facing the first aperture, and such that some of the side face portions have gentler slopes than the rest of the side face portions.

According to the method of manufacturing a thin film transistor element pertaining to one aspect of the present invention, in the fifth step, the partition walls are formed such that some of the side face portions facing the first aperture have gentler slopes than the rest of the side face portions. Therefore, when organic semiconductor material in the form of ink is applied, the surface of the ink is biased toward the gentle-slope side face portions. As a result, the ink is surely prevented from overflowing from the rest of the side face portions formed to have the steeper slopes (the steep-slope side face portions), and the thin film transistor element achieves high quality.

According to a method of manufacturing a thin film transistor element pertaining to one aspect of the present invention, in the fifth step, the first aperture is formed to function as a channel portion with the organic semiconductor layer to be formed inside the first aperture, and the partition walls are formed to define a second aperture with a gap between the first aperture and the second aperture, the second aperture not functioning as a channel portion. Furthermore, the partition walls are formed such that among the side face portions facing the first aperture, said some of the side face portions having the gentler slopes do not include a side face portion that is adjacent to the second aperture.

In the case of preventing the overflow of the ink toward the second aperture, the partition walls are formed such that the gentler-slope side face portions do not include a side face portion that is adjacent to the second aperture. This surely prevents the overflow of the ink into the second aperture.

Specific approaches to form the gentle-slope side face portions and steep-slope side face portions facing the first aperture include the following.

(1) In the manufacturing method pertaining to one aspect of the present invention, in the fifth step, said rest of the side face portions are formed by a greater degree of exposure to light relative to said some of the side face portions having the gentler slopes.

(2) In the manufacturing method pertaining to one aspect of the present invention, in the fifth step, after sections of the layer of photosensitive resist material corresponding in position to the side face portions facing the first aperture are exposed to light, sections of the layer of photosensitive resist material corresponding in position to said rest of the side face portions are further exposed to light.

(3) In the manufacturing method pertaining to one aspect of the present invention, in the fifth step, the layer of photosensitive resist material is exposed to light through a mask, and sections of the mask corresponding in position to said rest of the side face portions have a higher optical transmission rate than sections of the mask corresponding in position to said some of the side face portions having the gentler slopes.

Any of the above-described approaches (1) through (3) may be adopted to surely form the gentle and steep side face portions.

One aspect of the present invention pertaining to the present invention is a method of manufacturing an organic EL display element, including the following steps:

(I) Step A: forming a thin film transistor element.

(II) Step B: forming a planarizing film with a contact hole therein on the thin film transistor element.

(III) Step C: forming a lower electrode on the planarizing film so as to cover the planarizing film and a side surface of the planarizing film defining the contact hole, the lower electrode being electrically connected with the thin film transistor element.

(IV) Step D: forming an organic light-emitting layer above the lower electrode.

(V) Step E: forming an upper electrode above the organic light-emitting layer.

According to a method of manufacturing an organic EL display element pertaining to the present invention, (I) Step A described above includes (i) the first step through (vi) the sixth step as follows.

(i) First step: forming a gate electrode on a substrate.

(ii) Second step: forming an insulating layer on the gate electrode;

(iii) Third step: forming a source electrode and a drain electrode on the insulating layer so as to be adjacent to each other with a gap therebetween.

(iv) Fourth step: depositing a layer of photosensitive resist material such that, above the insulating layer, the layer of photosensitive resist material covers the source electrode and the drain electrode as well as areas therearound.

(v) Fifth step: forming partition walls on the insulating layer by performing mask exposure and patterning of the layer of photosensitive resist material, the partition walls having liquid-repellant surfaces and defining a first aperture, the first aperture surrounding at least a part of the source electrode and at least a part of the drain electrode.

(vi) Sixth step: forming an organic semiconductor layer so as to be in contact with the source electrode and the drain electrode by applying organic semiconductor material within the first aperture and drying the organic semiconductor material so applied.

According to a method of manufacturing an organic EL display element pertaining to one aspect of the present invention, in (v) Fifth step, the partition walls are formed such that the partition walls have side face portions facing the first aperture, and such that some of the side face portions have gentler slopes (gentle-slope side face portions) than the rest of the side face portions.

As described above, according to the method of manufacturing an organic EL display element pertaining to one aspect of the present invention, in (v) Fifth step of (I) Step A, the partition walls are formed such that the partition walls have side face portions facing the first aperture, and such that some of the side face portions are formed as gentle-slope side face portions having gentler slopes and the rest of the side face portions are formed as steep-slope side face portions. Therefore, in the process of forming the organic semiconductor layer, the overflow of the organic semiconductor ink into an undesired area can be surely prevented for the same reasons as described above. As a result, it is possible to manufacture an organic EL display element with high quality.

Also, according to a method of manufacturing an organic EL display element pertaining to one aspect of the present invention, in (v) Fifth step of (I) Step A, the first aperture is formed to function as a channel portion with the organic semiconductor layer to be formed inside the first aperture, and the partition walls are formed to define a second aperture with a gap between the first aperture and the second aperture, the second aperture not functioning as a channel portion. In this case, the partition walls are formed such that among the side face portions facing the first aperture, the gentle-slope side face portions do not include a side face portion that is adjacent to the second aperture.

When this manufacturing method is adopted, the overflow of the ink into the second aperture, where the formation of the organic semiconductor layer is undesirable, can be surely prevented. As a result, it is possible to manufacture an organic EL display element with high quality.

Note that in the above, when a given element is "on" or "above" another element, the given element is not limited to being disposed in the absolutely vertical direction with respect to the other element. Instead, in the present disclosure, the terms "on" and "above" are used to indicate the relative positions of different elements, or more specifically, the relative positions of different elements along the direction in which such elements are layered. Further, in the present disclosure, the term "above" are each used to indicate not only one but both of a state where a gap exists between two elements and a state where the two elements are in close contact with each other.

In the following, explanation is provided of characteristics of various forms of implementation and the effects achieved thereby, with reference to several specific examples thereof. Further, note that although the following embodiments include description on fundamental characteristic features, the present disclosure is not to be construed as being limited to the description provided in the following embodiments other than such fundamental features.

Embodiment 1

1. Overall Structure of Organic EL Display Device 1

In the following, description is provided on a structure of an organic EL display device 1 pertaining to embodiment 1 of the present disclosure, with reference to FIG. 1.

As illustrated in FIG. 1, the organic EL display device 1 includes an organic EL display panel 10 and a drive control circuit portion 20 connected to the organic EL display panel 10.

The organic EL display panel 10 is a panel that makes use of electroluminescence of organic material. The organic EL display panel 10 is composed of a plurality of organic EL elements that are, for instance, arranged so as to form a matrix. The drive control circuit portion 20 includes four drive circuits, namely drive circuits 21 through 24, and a control circuit 25.

Note that, in the organic EL display device 1 pertaining to the present embodiment, the positional arrangement of the drive control circuit portion 20 with respect to the organic EL display panel 10 is not limited to that illustrated in FIG. 1.

2. Structure of Organic EL Display Panel 10

In the following, description is provided on a structure of the organic EL display panel 10, with reference to the schematic cross-sectional view of FIG. 2, and FIG. 3A.

Figure 2:
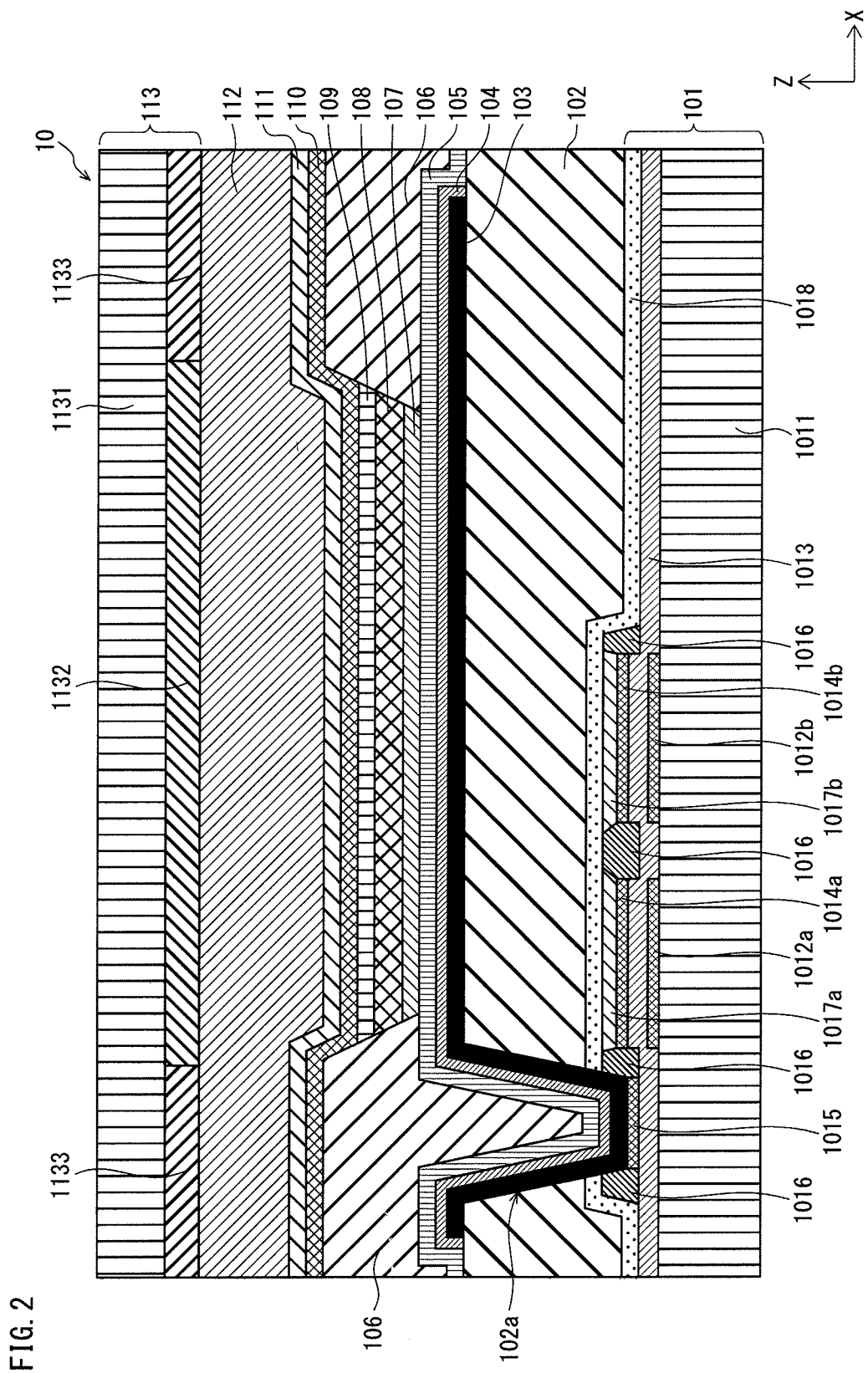
FIG. 2 is a schematic cross-sectional view illustrating a partial structure of an organic EL display panel 10.

As illustrated in FIG. 2, the organic EL display panel 10 includes a thin film transistor (TFT) substrate 101. The TFT substrate 101 has a structure where gate electrodes 1012a, 1012b are layered on a substrate 1011 with a gap between one another, and an insulating layer 1013 is layered so as to cover the substrate 1011 and the gate electrodes 1012a, 1012b. On the insulating layer 1013, source electrodes 1014a, 1014b, respectively corresponding to the gate electrodes 1012a, 1012b are disposed. Further, as illustrated in FIG. 3A, drain electrodes 1014c, 1014d are disposed on the insulating layer 1013. The drain electrodes 1014c, 1014d respectively correspond to the source electrodes 1014a, 1014b, and are each disposed so as to be located apart from a corresponding one of the source electrodes 1014a, 1014b in the Y axis direction with a gap therebetween.

In addition, as illustrated in FIG. 2 and FIG. 3A, a connection wire 1015 is disposed on the insulating layer 1013 at the left side of the source electrode 1014a in the X axis direction, and such that there is a gap between the connection wire 1015 and the source electrode 1014a. The connection wire 1015 is formed by extending the source electrode 1014a or the drain electrode 1014c. Alternatively, the connection wire 1015 is electrically connected to the source electrode 1014a or the drain electrode 1014c.

Further, as illustrated in FIGS. 2 and 3A, partition walls 1016 are disposed on the insulating layer 1013. The partition walls 1016 surround (a) the connection wire 1015, (b) a combination of the source electrode 1014a and the drain electrode 1014c, and (c) a combination of the source electrode 1014b and the drain electrode 1014d, in such a manner that (a), (b), and (c) are separated from one another by being surrounded by the partition walls 1016. In other words, as illustrated in FIG. 3A, the partition walls 1016 define three apertures, namely an aperture 1016a, an aperture 1016b, and an aperture 1016c. The aperture 1016a at the far left side in the X axis direction has a bottom portion where the connection wire 1015 remains exposed. The aperture 1016a is not a channel portion and functions as a contact portion that contacts an anode. On the other hand, the aperture 1016b has a bottom portion where the source electrode 1014a and the drain electrode 1014c remain exposed, and the aperture 1016c has a bottom portion where the source electrode 1014b and the drain electrode 1014d remain exposed. The apertures 1016b and 1016c function as channel portions.

Within the aperture 1016b defined by the partition walls 1016, an organic semiconductor layer 1017a is disposed on the source electrode 1014a and the drain electrode 1014c included therein. Similarly, within the aperture 1016c defined by the partition walls 1016, an organic semiconductor layer 1017b is disposed on the source electrode 1014b and the drain electrode 1014d. More specifically, the organic semiconductor layer 1017a is formed so as to cover the source electrode 1014a and the drain electrode 1014c and also fill a gap between the source electrode 1014a and the drain electrode 1014c. The organic semiconductor layer 1017a so formed is in contact with the source electrode 1014a and the drain electrode 1014c. The organic semiconductor layer 1017b is formed in a similar manner and is in contact with the source electrode 1014b and the drain electrode 1014d. Further, the organic semiconductor layer 1017a and the organic semiconductor layer 1017b are partitioned from each other by the partition walls 1016.

Further, as illustrated in FIG. 2, a passivation film 1018 is disposed so as to cover the organic semiconductor layer 1017a, the organic semiconductor layer 1017b, and the insulating layer 1013. However, it should be noted that the passivation film 1018 is not disposed above the area corresponding to the connection wire 1015, and therefore, an opening is formed at such an area.

The TFT substrate 101 of the organic EL display panel 10 pertaining to the present embodiment has a structure as described up to this point.

Next, as illustrated in FIG. 2, a planarizing film 102 covers the TFT substrate 101 from above. However, it should be noted that a contact hole 102a is formed at an area above the connection wire 1015. An anode 103, a light-transmissive conduction film 104, and a hole injection layer 105 are disposed in the stated order on a main surface of the planarizing film 102. Here, each of the anode 103, the light-transmissive conduction film 104, and the hole injection layer 105 is disposed not only on the planarizing film 102 but also along a side surface of the planarizing film 102 defining the contact hole 102a. The anode 103 is in contact with and electrically connected to the connection wire 1015.

Further, banks 106 are disposed on the hole injection layer 105. The banks 106 are disposed so as to surround an area above the hole injection layer 105 that corresponds to a light-emitting portion (i.e., a subpixel). In an opening formed at the above-described area by the banks 106, a hole transport layer 107, an organic light-emitting layer 108, and an electron transport layer 109 are disposed in the stated order.

On the electron transport layer 109 and on exposed surfaces of the banks 106, a cathode 110 and a sealing layer 111 are disposed in the stated order so as to cover the electron transport layer 109 and the exposed surfaces of the banks 106. Further, a color filter (CF) substrate 113 is arranged so as to face the sealing layer 111. The sealing layer 111 and the CF substrate 113 are joined together by an adhesion layer 112 filling a gap therebetween. The CF substrate 113 includes a substrate 1131, and a color filter 1132 and a black matrix 1133 disposed on a main surface of the substrate 1131. The main surface of the substrate 1131 is a surface of the substrate 1131 that is located lower in the Z axis direction.

3. Material Constituting Organic EL Display Panel 10

Each part of the organic EL display panel 10 may, for instance, be formed by using the materials as described in the following.

(i) Substrate 1011

The substrate 1011 may be, for instance: a glass substrate; a quartz substrate; a silicon substrate; a metal substrate composed of, for example, molybdenum sulfide, copper, zinc, aluminum, stainless steel, magnesium, iron, nickel, gold, or silver; a semiconductor substrate composed of, for example, gallium arsenide; or a plastic substrate.

Examples of material constituting the plastic substrate include thermoplastic resins and thermosetting resins. Examples thereof include polyolefins, such as polyethylene, polypropylene, ethylene-propylene copolymers, and ethylene-vinyl acetate copolymers (EVA), cyclic polyolefin, modified polyolefins, polyvinyl chloride, polyvinylidene chloride: polystyrene, polyamide, polyimide (PI), polyamide-imide, polyesters, such as polycarbonate, poly(4-methylpentene-1), ionomers, acrylic-based resins, polymethyl methacrylater acrylic-styrene copolymers (AS resins), butadiene-styrene copolymers, ethylene vinyl alcohol copolymers (EVOH), polyethylene terephthalate (PET), polybutylene terephthalate, polyethylene naphthalate (PEN), and polycyclohexane terephthalate (PCT), polyether, polyether ketone, polyethersulfone (PES), polyether imide, polyacetal, polyphenylene oxide, modified polyphenylene oxide, polyarylate, aromatic polyesters (liquid crystal polymer), polytetrafluoroethylene, polyvinylidene fluoride, other fluorocarbon resins, thermoplastic elastomers, such as styrene-based elastomers, polyolefin-based elastomers, polyvinyl chloride-based elastomers, polyurethane-based elastomers, fluorocarbon rubbers, and chlorinated polyethylene-based elastomers, epoxy resins, phenolic resins, urea resins, melamine resins, unsaturated polyesters, silicone resins, and polyurethane, and copolymers, blends, and polymer alloys thereof. The plastic substrate may be a single layer substrate composed of one of the materials described above or a multilayer substrate having layers composed of two or more materials.

(ii) Gate Electrodes 1012a, 1012b

The gate electrodes 1012a, 1012b may be made of, for instance, any material having electrical conductivity.

Specific examples thereof include metals, such as chromium, aluminum, tantalum, molybdenum, niobium, copper, silver, gold, platinum, palladium, indium, nickel, and neodymium, and alloys thereof; conductive metal oxides, such as zinc oxide, tin oxide, indium oxide, and gallium oxide; conductive metal complex oxides, such as indium tin complex oxide (ITO), indium zinc complex oxide (IZO), aluminum zinc complex oxide (AZO), and gallium zinc complex oxide (GZO); conductive polymers, such as polyaniline, polypyrrole, polythiophene, and polyacetylene, and conductive polymers doped with acids, e.g., hydrochloric acid, sulfuric acid, and sulfonic acid, Lewis acids, e.g., phosphorus pentafluoride, arsenic pentafluoride, and iron chloride, halogen elements, e.g., iodine, and metals, e.g., sodium and potassium; and conductive composite materials containing carbon black and metal particles dispersed. Alternatively, polymer mixtures containing conductive particles, such as fine metal particles and graphite, may be used. These materials may be used alone or in combination.

(iii) Insulating Layer 1013

The insulating layer 1013 functions as a gate insulating layer. The insulating layer 1013 may be made, for instance, of any material having insulative properties. Examples of the material that can be used include organic insulating materials and inorganic insulating materials.

Examples of organic insulating materials include acrylic resins, phenolic resins, fluororesins, epoxy resins, imide resins, and novolac type resins.

Examples of inorganic insulating materials include: metal oxides, such as silicon oxide, aluminum oxide, tantalum oxide, zirconium oxide, cerium oxide, zinc oxide, and cobalt oxide; metal nitrides, such as silicon nitride, aluminum nitride, zirconium nitride, cerium nitride, zinc nitride, cobalt nitride, titanium nitride, and tantalum nitride; and metal complex oxides, such as barium strontium titanate and lead zirconate titanate. These may be used alone or in combination.

Further, the insulating layer 1013 may have a surface thereof processed by using a surface treatment agent (ODTS OTS HMDS (3PTS) or the like.

(iv) Source Electrodes 1014a, 1014b, Drain Electrodes 1014c, 1014d and Connection Wire 1015

The source electrodes 1014a, 1014b, the drain electrodes 1014c, 1014d and the connection wire can be formed by using the same materials as used for forming the gate electrodes 1012a, 1012b.

(v) Organic Semiconductor Layers 1017a, 1017b

The organic semiconductor layers 1017a, 1017b may be formed by using, for instance, any material that has semiconducting properties and is soluble to a solvent. Specific examples thereof include thiophene-based materials, such as poly(3-alkylthiophene), poly(3-hexylthiophene) (P3HT), poly(3-octylthiophene), poly(2,5-thienylene vinylene) (PTV), quarterthiophene (4T), sexithiophene (6T), octathiophene, 2,5-bis(5'-biphenyl-2'-thienyl)thiophene (BPT3), 2,5-[2,2'-(5,5'-diphenyl)dithienyl]thiophene, and [5,5'-bis(3-dodecyl-2-thienyl)-2,2'-bithiophene] (PQT-12); phenylene vinylene-based materials such as poly(paraphenylene vinylene) (PPV); fluorene-based materials such as poly(9,9-dioctylfluorene) (PFO); triallylamine-based polymers; acene-based materials, such as anthracene, tetracene, pentacene, and hexacene; benzene-based materials, such as 1,3,5-tris[(3-phenyl-6-trifluoromethyl)quinoxalin-2-yl]benzene (TPQ1) and 1,3,5-tris[{3-(4-tert-butylphenyl)-6-trisfluoromethyl}quinoxalin-2-yl]benzene (TPQ2); phthalocyanine-based materials, such as phthalocyanine, copper phthalocyanine (CuPc), iron phthalocyanine, and perfluorophthalocyanine; organometallic materials, such as tris(8-hydroxyquinoline)aluminum (Alq3) and fac-tris(2-phenylpyridine) iridium (Ir(ppy)3); C60; polymers, such as, oxadiazole-based polymers, triazole-based polymers, carbazole-based polymers, and fluorene-based polymers; poly(9,9-dioctylfluorene-co-bis-N,N-(4-methoxyphenyl)-bis-N,N'-phenyl-1,4-phenylenediamine) (PFMO); poly(9,9-dioctylfluorene-co-benzothiadiazole) (BT); fluorene-triallylamine copolymers; and copolymers of fluorene and poly(9,9-dioctylfluorene-co-dithiophene) (F8T2). These materials may be alone or in combination.

Alternatively, the organic semiconductor layers 1017a, 1017b may be formed by using an inorganic material that is soluble in a solvent.

(vi) Passivation Film 1018

The passivation film 1018 may be formed by using, for instance, a water soluble resin such as polyvinyl alcohol (PVA), or a fluororesin.

(vii) Planarizing Film 102

The planarizing film 102 is formed by using, for instance, an organic compound such as polyimide, polyamide, and acrylic resin material.

(viii) Anode 103

The anode 103 is made of a metal material containing silver (Ag) or aluminum (Al). Further, in a top-emission type display panel such as the organic EL display panel 10 pertaining to the present embodiment, it is desirable that a surface portion of the anode 103 have high reflectivity.

(ix) Light-transmissive Conduction Film 104

The light-transmissive conduction film 104 is formed by using, for instance, Indium Tin Oxide (ITO), Indium Zinc Oxide (IZO), or the like.

(x) Hole Injection Layer 105

The hole injection layer 105 is a layer made of, for instance, an oxide of a metal such as silver (Ag), molybdenum (Mo), chromium (Cr), vanadium (V), tungsten (W), nickel (Ni), and iridium (Ir), or a conductive polymer material such as PEDOT (an amalgam of polythiophene and polystyrene sulfonic acid). The hole injection layer 105 in the organic EL display panel 10 pertaining to the present embodiment as illustrated in FIG. 2 is assumed to be made of a metal oxide. In such a case, the hole injection layer 105 is provided with a function of assisting hole generation and injecting holes into the organic light-emitting layer 108 with a higher level of stability, compared to when the hole injection layer 105 is made of a conductive polymer material such as PEDOT. As such, the hole injection layer 105, when made of a metal oxide, has a higher work function than the hole injection layer 105, when made of a conductive polymer material.

Here, a case where the hole injection layer 105 is made of an oxide of a transition metal is considered. In such a case, a plurality of levels can be occupied since there are a plurality of oxidation numbers. This makes hole injection easy and allows for reduction of driving voltage. It is particularly desirable to form the hole injection layer 105 by using tungsten Oxide (WOx) since the hole injection layer 105 can be provided with the function of stably injecting holes and assisting the generation of holes.

(xi) Banks 106

The banks 106 are formed by using an organic material such as resin and have insulative properties. Example of organic material usable for forming the banks 106 include acrylic resins, polyimide resins, and novolac type phenolic resin. In addition, it is desirable that the banks 106 have organic solvent resistance. Further, since the banks 106 may undergo processes such as etching, baking, etc. when being formed, it is desirable that the banks 106 be formed from highly resistant material that will not change excessively in shape or quality during such processes. In addition, to provide the banks 106 with liquid repellency, the surfaces thereof can be fluoridated.

This is since, if a liquid-philic material is used to form the banks 106, the difference in liquid philicity/liquid repellency between the surfaces of the banks 106 and the surface of organic light-emitting layer 108 becomes small, and it thus becomes difficult to keep ink including an organic substance for forming the organic light-emitting layer 108 to be selectively held within the apertures defined by the banks 106.

In addition, the banks 106 need not be formed so as to have a single-layer structure as shown in FIG. 2. That is, the banks 106 may be alternatively formed so as to have a structure including two or more layers. In such a case, the above materials may be combined for each layer, or layers may alternate between inorganic and organic material.

(xii) Hole Transport Layer 107

The hole transport layer 107 is formed by using a high-molecular compound not containing a hydrophilic group. For instance, the hole transport layer 107 may be formed by using a high-molecular compound such as polyfluorene or a derivative thereof, and polyallylamine or a derivative thereof, but not containing a hydrophilic group.

(xiii) Organic Light-emitting Layer 108

The organic light-emitting layer 108 has a function of emitting light when an excitation state is produced by the recombination of holes and electrons injected thereto. It is desirable that material used to form the organic light-emitting layer 108 is a light emitting-organic material, a film of which can be formed by wet printing.

Specifically, it is desirable that the organic light-emitting layer 108 be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

(xiv) Electron Transport Layer 109

The electron transport layer 109 has a function of transporting electrons injected through the cathode 110 to the organic light-emitting layer 108, and is formed by using, for instance, an oxadiazole derivative (OXD), a triazole derivative (TAZ), a phenanthroline derivative (BCP, Bphen), or the like.

(xv) Cathode 110

The cathode 110 is formed by using, for instance, Indium Tin Oxide (ITO), Indium Zinc Oxide (IZO), or the like. Further, in a top-emission type display panel such as the organic EL display panel 10 pertaining to the present embodiment, it is desirable that the cathode 110 be formed by using light-transmissive material. When forming the cathode 110 by using light-transmissive material as described above, it is desirable that the cathode 110 be provided with light-transmissivity of 80% or greater.

In addition to the materials presented above, the following materials may be used to form the cathode 110. That is, the cathode 110 may be formed, for instance, as a layer including an alkali metal, a layer including an alkali earth metal, or a layer including an alkali earth metal halide. Alternatively, the cathode 110 may be formed as a laminate including one of the above-described layers and a layer including Ag laminated in the stated order. When the cathode 110 is formed as a laminate as described above, the layer including Ag may be formed with Ag alone, or with an alloy of Ag. Further, in order to enhance the efficiency with which light is guided out from the organic EL display panel 10, a highly light-transmissive, refraction index adjustment layer may be provided above the layer including Ag.

(xvi) Sealing Layer 111

The sealing layer 111 has a function of preventing organic layers such as the organic light-emitting layer 108 from being exposed to water and/or air and is formed by using, for example, material such as silicon nitride (SiN) and silicon oxynitride (SiON). In addition, a sealing resin layer made of a resin material such as acrylic resin and silicone resin may be further disposed above the sealing layer, which is formed by using material such as silicon nitride (SiN) and silicon oxynitride (SiON) as described above.

Further, in a top-emission type display panel such as the organic EL display panel 10 pertaining to the present embodiment, it is desirable that the sealing layer 111 be formed by using light-transmissive material.

4. Structure of Partition Walls 1016 in TFT Substrate 101

In the structure of the organic display panel 10, the partition walls 1016 in the TFT substrate 101 and an area around the partition walls 1016 are described with reference to FIGS. 3A and 3B.

As shown in FIG. 3A and FIG. 3B, in the TFT substrate 101 of the organic EL display panel 10 pertaining to the present embodiment, the banks 106 are formed to surround a part of the connection wire 1015, a part of the source electrode source electrode 1014a, a part of the drain electrode 1014c, a part of the source electrode 1014b and a part of the drain electrode 1014d. Thus the partition walls 1016 define three apertures, namely an aperture 1016a, an aperture 1016b and an aperture 1016c as shown in FIG. 3A and FIG. 3B. Note that although FIG. 3A and FIG. 3B do not show the structures corresponding to other subpixels in the TFT substrate 101, they have the same structure as described above.

At the bottom portion of the aperture 1016a, which is the leftmost aperture in the X axis direction, the connection wire 1015 is exposed. As described above, the connection wire 1015 is connected to the source electrode 1014a or the drain electrode 1014c (the drain electrode 1014c in the present embodiment). Also, as shown in FIG. 2, the anode 103 is to be connected to the connection wire 1015.

As shown in FIG. 3A and FIG. 3B, at the bottom portion of the aperture 1016b, which is the central aperture in the X axis direction, a part of the source electrode 1014a and a part of the drain electrode 1014c are exposed, and at the bottom portion of the aperture 1016c, which is the rightmost aperture in the X axis direction, a part of the source electrode 1014b and a part of the drain electrode 1014d are exposed.

As shown in FIG. 3A, within the apertures 1016b and 1016c, the source electrodes 1014a and 1014b and the drain electrodes 1014c and 1014d are arranged with a gap in the Y axis direction. Within the apertures 1016b and 1016c, the organic semiconductor layers 1017a and 1017b are formed as described above, which serve as channel portions.

Next, as shown in FIG. 3B, in the TFT substrate 101 pertaining to the present embodiment, some of the side face portions of the partition walls 1016 facing the apertures 1016a, 1016b and 1016c have relatively gentler slopes. Specifically, among the side face portions of the partition walls 1016 facing the aperture 1016b, the side face portion 1016e that is adjacent to the aperture 1016c has a gentler slope than the side face portion 1016d that is adjacent to the aperture 1016a.

Similarly, among the side face portions of the partition walls 1016 facing the aperture 1016c, the side face portion 1016f that is adjacent to the aperture 1016b has a gentler slope than the side face portion 1016g that is opposite the side face portion 1016f with respect to the aperture 1016c.

Furthermore, as shown in FIG. 3A, among the side face portions of the partition walls 1016 facing the aperture 1016b, the side face portions 1016h and 1016i, which are opposite each other in the Y axis direction, have a steeper slope than the side face portion 1016e in the same manner as the side face portion 1016d. Similarly, among the side face portions of the partition walls 1016 facing the aperture 1016c, the side face portions 1016j and 1016k, which are opposite each other in the Y axis direction, have a steeper slope than the side face portion 1016f in the same manner as the side face portion 1016g.

Here, according to the present embodiment, θd, θe, θh and θi satisfy the following relationship. Note that θd denotes the inclination angle of the side face portion 1016d with reference to the surfaces of the insulating layer 1013 as the underlayer, the source electrode 1014a and the drain electrode 1014c, θe denotes the inclination angle of the side face portion 1016e with reference to the same, θh denotes the inclination angle of the side face portion 1016h with reference to the same, and θi denotes the inclination angle of the side face portion 1016i with reference to the same:

$$\theta d > \theta e \quad \text{[Math. 1]}$$

$$\theta h > \theta e \quad \text{[Math. 2]}$$

$$\theta i > \theta e \quad \text{[Math. 3]}$$

Furthermore, θf, θg, θj and θk satisfy the following relationship. Note that θf denotes the inclination angle of the side face portion 1016f with reference to the surfaces of the insulating layer 1013 as the underlayer, the source electrode 1014b and the drain electrode 1014d, θg denotes the inclination angle of the side face portion 1016g with reference to the same, θj denotes the inclination angle of the side face portion 1016j with reference to the same, and θk denotes the inclination angle of the side face portion 1016k with reference to the same:

$$\theta g > \theta f \quad \text{[Math. 4]}$$

$$\theta j > \theta f \quad \text{[Math. 5]}$$

$$\theta k > \theta f \quad \text{[Math. 6]}$$

Here, it is desirable that the inclination angles θe and θf the gentle slopes of the side face portions 1016e and 1016f (gentle-slope side face portions 1016e and 1016f) are smaller than the inclination angles θd, θg, θh, θi, θj and θk of the steep slopes of the side face portions 1016d, 1016g, 1016h, 1016i, 1016j and 1016k (steep-slope side face portions 1016d, 1016g, 1016h, 1016i, 1016j and 1016k) by 5 degrees or more.

It is also desirable that the inclination angles θe and θf the gentle slopes of the side face portions 1016e and 1016f (gentle-slope side face portions 1016e and 1016f) fall within the range from 25 degrees to 30 degrees. Furthermore, it is desirable that the inclination angles θd, θg, θh, θi, θj and θk of the steep-slope side face portions 1016d, 1016g, 1016h, 1016i, 1016j, 1016k fall within the range from 35 degrees to 40 degrees.

In the banks 106, the side face portions 1016d through 1016k facing the apertures 1016a, 1016b and 1016c are set to have different inclination angles as described above in order to prevent organic semiconductor ink from overflowing into the aperture 1016a during the formation of the organic semiconductor layers 1017a and 1017b. In other words, the side face portions 1016d through 1016k are configured to bias the surface shapes of the organic semiconductor ink applied with respect to the apertures 1016b and 1016c toward the gentle-slope side face portions 1016e and 1016f. This will be described later in detail.

5. Method of Manufacturing Organic EL Display Device 1

In the following, description is provided on a method of manufacturing the organic EL display device 1, and in particular, a method of manufacturing the organic EL display panel 10, with reference to FIG. 2 and FIGS. 4A and 4B.

Figure 4A:
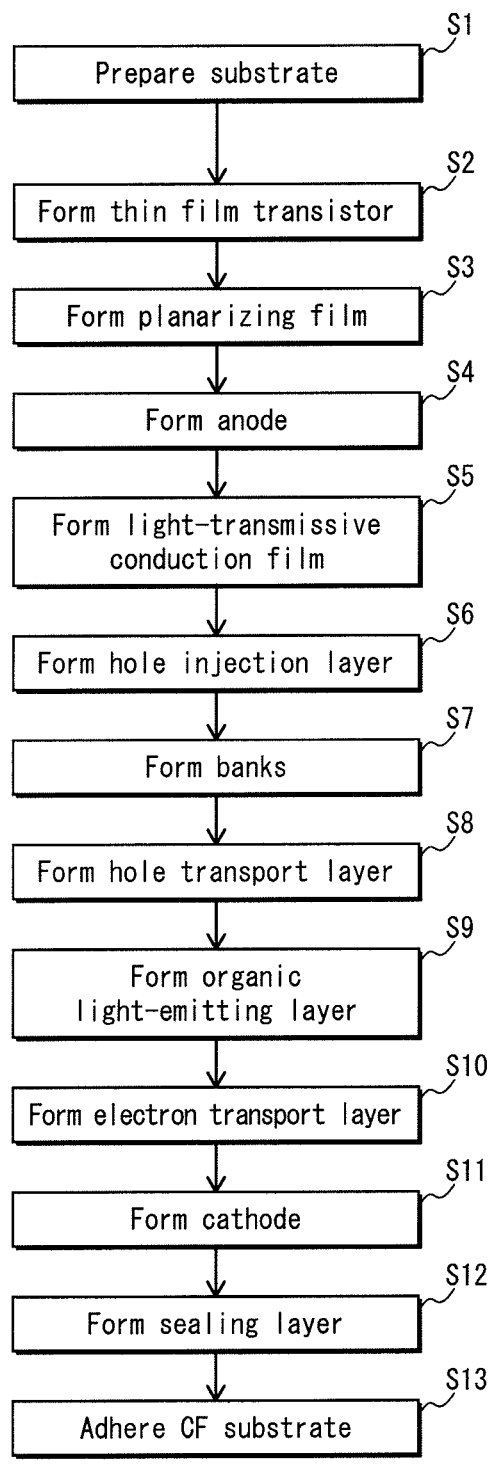
FIG. 4A is a process flow diagram providing an overview of a method of manufacturing the organic EL display panel 10.

First, as illustrated in FIG. 2 and FIG. 4A, the substrate 1011 is prepared (Step S1). The substrate 1011 serves as a base of the TFT substrate 101. Then, the TFT substrate 101 is formed by forming a thin film transistor (TFT) element on the substrate 1011 (Step S2).

Then, as illustrated in FIG. 2 and FIG. 4A, the planarizing film 102, which is made of insulative material, is formed on the TFT substrate 101 (Step S3). As illustrated in FIG. 2, the planarizing film 102 has the contact hole 102a formed therein at an area above the connection wire 1015 in the TFT substrate 101. Further, the planarizing film 102 is formed such that upper surfaces in the Z axis direction of portions thereof other than the contact hole 102a are substantially planar.

Then, the anode 103 is formed on the planarizing film 102 (Step S4). As illustrated in FIG. 2, the anode 103 in the organic EL display panel 10 is formed so as to be partitioned in units of light emission (i.e., in units of subpixels). Further, the anode 103 is formed so as to have a portion that is connected to the connection wire 1015 of the TFT substrate 101 by being formed along the side surface of the planarizing film 102 defining the contact hole 102a.

Here, note that the anode 103 can be formed, for instance, by first forming a metal film according to the sputtering method, the vacuum vapor deposition method, or the like, and then etching the metal film so formed to obtain subpixel units.

Then, the light-transmissive conduction film 104 is formed so as to cover an upper surface of the anode 103 (Step S5). As illustrated in FIG. 2, the light-transmissive conduction film 104 covers not only the upper surface of the anode 103 but also surfaces of lateral edges of the anode 103. Further, the light-transmissive conduction film 104 also covers the upper surface of the anode 103 within the contact hole 102a. Note that the light-transmissive conduction film 104 can also be formed, for instance, by first forming a film according to the sputtering method, the vacuum vapor deposition method, or the like, and then etching the film so formed to obtain subpixel units.

Then, the hole injection layer 105 is formed on the light-transmissive conduction film 104 (Step S6). Note that, although the hole injection layer 105 is formed so as to cover the entire light-transmissive conduction film 104 in FIG. 2, the hole injection layer 105 may alternatively be formed so as to be partitioned into subpixel units.

Further, when forming the hole injection layer 105 by using a metal oxide (e.g., tungsten oxide), the formation of the metal oxide film can be performed according to specific film forming conditions. For instance, the metal oxide film can be formed under film forming conditions such that: (i) a gas including argon gas and oxygen gas is used as a sputtering gas in a chamber of a sputtering device for forming the metal oxide film; (ii) a total pressure of the sputtering gas is higher than 2.7 Pa and lower than or equal to 7.0 Pa; (iii) a partial pressure of the oxygen gas in the sputtering gas is at least 50% and at most 70%; and (iv) an input power density per unit area of the sputtering target is at least 1.0 W/cm$^2$ and at most 2.8 W/cm$^2$.

Then, the banks 106 defining subpixels of the organic EL display panel 10 are formed (Step S7). As illustrated in FIG. 2, the banks 106 are formed so as to be layered onto the hole injection layer 105.

In specific, the banks 106 are formed by first forming a layer of material for forming the banks 106 (hereinafter referred to as a "material layer") on the hole injection layer 105. The material layer is formed, for instance, by using a material including a photosensitive resin component and a fluorine component such as acrylic resin, polyimide resin, and novolac-type phenolic resin, and according to the spin coating method, or the like. Note that, in the present embodiment, a negative photosensitive material manufactured by Zeon Corporation (product code: ZPN1168), which is one example of a photosensitive resin material, can be used for forming the material layer. Subsequently, by patterning the material layer so formed, apertures corresponding to the sub-pixels of the organic EL display panel 10 are formed. The forming of the apertures can be performed by disposing a mask onto the surface of the material layer, performing exposure from over the mask, and finally performing developing.

Then, in each concavity on the hole injection layer 105 defined by the banks 106, the hole transport layer 107, the organic light-emitting layer 108, and the electron transport layer 109 are formed in the stated order so as to be layered one on top of another (Steps S8 through S10).

The hole transport layer 107 is formed by first forming, according to the printing method, a film made of an organic compound for forming the hole transport layer 107, and then sintering the film so formed. The organic light-emitting layer 108 is similarly formed by first forming a film according to the printing method, and then sintering the film so formed.

Then, the cathode 110 and the sealing layer 111 are layered onto the electron transport layer 109 in the stated order (Steps S11 and S12). As illustrated in FIG. 2, the cathode 110 and the sealing layer 111 are formed so as to cover the layers therebelow entirely, including top surfaces of the banks 106.

Then, an adhesive resin material for forming the adhesion layer 112 is applied onto the sealing layer 111, and a color filter (CF) panel having been prepared in advance is adhered onto the sealing layer 111 via the adhesive layer 112 (Step S13). As illustrated in FIG. 2, the CF substrate 113 adhered onto the sealing layer 111 via the adhesion layer 112 includes the substrate 1131, and the color filter 1132 and the black matrix 1133 formed on the surface of the substrate 1131 that is located lower in the Z axis direction.

As such, the manufacturing of the organic EL display panel 10, which is an organic EL display element, is completed.

Note that, although illustration is not provided in the drawings, the manufacturing of the organic EL display device 1 is completed by annexing the drive control circuit portion 20 to the organic EL display panel 10 (refer to FIG. 1), and then performing aging processing. The aging processing is performed by, for instance, causing the organic EL display device 1 to conduct until the mobility of holes in the organic EL display device 1 reaches ⅒ or lower with respect to the hole injection characteristics before the aging processing. More specifically, in the aging processing, the organic EL display device 1 is electrified for a predetermined time period while maintaining the luminous intensity of the organic EL display device 1 to be at least equal to the luminous intensity upon actual usage and at most three times the luminous intensity upon actual usage.

Subsequently, description is provided on a method of forming the TFT substrate 101, with reference to FIG. 3B and FIG. 4B.

Figure 4B:
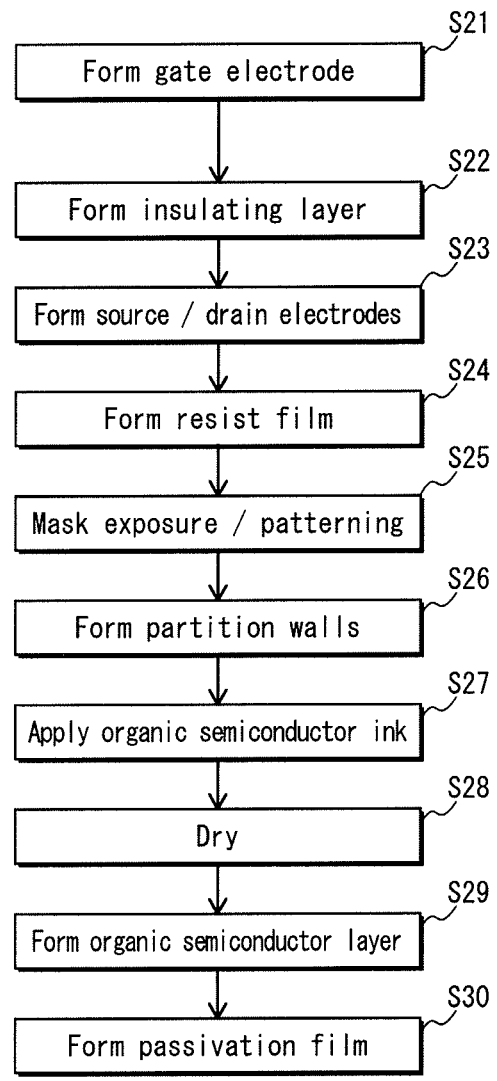
FIG. 4B is a process flow diagram providing an overview of a method of forming the TFT substrate 101.

As illustrated in FIG. 3B and FIG. 4B, the gate electrodes 1012a, 1012b are formed on a main surface of the substrate 1011 (Step S21). Note that the formation of the gate electrodes 1012a, 1012b may be performed according to the above-described method applied in the formation of the anode 103.

Then, the insulating layer 1013 is formed so as to cover the substrate 1011 and the gate electrodes 1012a, 1012b (Step S22). Then, the source electrodes 1014a, 1014b, the drain electrodes 1014c, 1014d, and the connection wire 1015 are formed on a main surface of the insulating layer 1013 (Step S23).

Next, a resist film for forming the partition walls 1016 is deposited so as to cover the source electrodes 1014a, 1014b, the drain electrodes 1014c, 1014d, the connection wire 1015, and the insulating layer 1013 (Step S24). Subsequently, mask exposure and patterning is performed on the deposited resist film (Step S25), and then the partition walls 1016 are formed (Step S26). These steps will be described later based on a specific example.

After the partition walls 1016 are formed, organic semiconductor ink for forming the organic semiconductor layers 1017a, 1017b are respectively applied to the apertures 1016b, 1016c defined by the partition walls 1016 (Step S27). Subsequently, by drying the organic semiconductor ink (Step S28), the organic semiconductor layers 1017a, 1017b are formed (Step S29).

Finally, the formation of the TFT substrate 101 is completed by forming the passivation film 1018 so as to cover the entire surface except for the aperture 1016a (Step S30).

6. Surface Shape of Applied Organic Semiconductor Ink

The following describes the shape of the surface of organic semiconductor ink applied in Step S27 described above, with reference to FIG. 5.

As shown in FIG. 5, the surfaces of the organic semiconductor ink portions 10170 and 10171 respectively applied to the aperture 1016b and the aperture 1016c are not symmetric with respect to the X axis direction, and they are biased toward the boundary between the aperture 1016b and the aperture 1016c.

This is for the following reasons. Among the side face portions facing the aperture 1016b, the inclination angle of the side face portion 1016e is set to be gentler than the rest of the side face portions, and among the side face portions facing the aperture 1016c, the inclination angle of the side face portion 1016f is set to be gentler than the rest of the side face portions. Since the surfaces of the partition walls 1016 have a uniform liquid repellency, the shapes of the surfaces of the ink portions 10170 and 10171 are defined as shown in FIG. 5 based on the contact angles of the surfaces of the partition walls 1016 with the ink portions 10170 and 10171, the relationship between the tensions of the ink surfaces, and the relationship between the inclination angles of the side face portions of the partition walls 1016 facing the apertures 1016b and 1016c.

Here, although not depicted in the drawing, the side face portions 1016h, 1016i, 1016j and 1016k are steeper than the side face portions 1016e and 1016f (See FIG. 3A), the contact areas of the ink portions 10170 and 10171 with the side face portions 1016h, 1016i, 1016j and 1016k have the similar shapes as with the contact areas with the side face portions 1016d and 1016g.

7. Effects Achieved

In the TFT substrate 101 of the organic EL display panel 10 pertaining to the present embodiment, among the side face portions of the partition walls 1016 facing the apertures 1016b and 1016c, the side face portions 1016e and 1016f are configured to have smaller inclination angles than the other side face portions, namely side face portions 1016d and 1016g through 1016k. Therefore, when the organic semiconductor ink portions 10170 and 10171 are applied, the surfaces of the organic semiconductor ink portions 10170 and 10171 will be biased toward the gentle-slope side face portions 1016e and 1016f as shown in FIG. 5.

In the present embodiment, the connection wire 1015 for connection with the anode 103 is to be exposed at the bottom portion of the aperture 1016a (i.e., the aperture 1016a does not serve as a channel portion), and the aperture 1016a is the area where is desired to be protected from the overflow of the ink portion 10170. Considering this, the present embodiment surely prevents the ink portions 10170 and 10171 from undesirably overflowing into the aperture 1016a, by controlling the shapes of the surfaces of the ink portions 10170 and 10171 as shown in FIG. 5. In addition, the present embodiment also aims to prevent the ink portion 10171 from undesirably overflowing toward the right side of the aperture 1016b in the X axis direction.

Therefore, according to the TFT substrate 101 pertaining to the present embodiment, the ink portions 10170 and 10171 are surely prevented from undesirably overflowing into the areas where the organic semiconductor layers 1017a and 1017b should not be formed in the manufacturing of the TFT substrate 101. Hence the TFT substrate 101 achieves high quality. Accordingly, the organic EL display panel 10 including the TFT substrate 101 as a component thereof with the above-described effects achieves high quality, and furthermore, the organic EL display device 1 including such a display panel achieves high quality.

8. Formation Method for Partition Walls 1016 in TFT Substrate 101

Description is provided on a method of forming the TFT substrate 101, with reference to FIGS. 6A through 6C and FIGS. 7A and 7B.

Figure 6A:
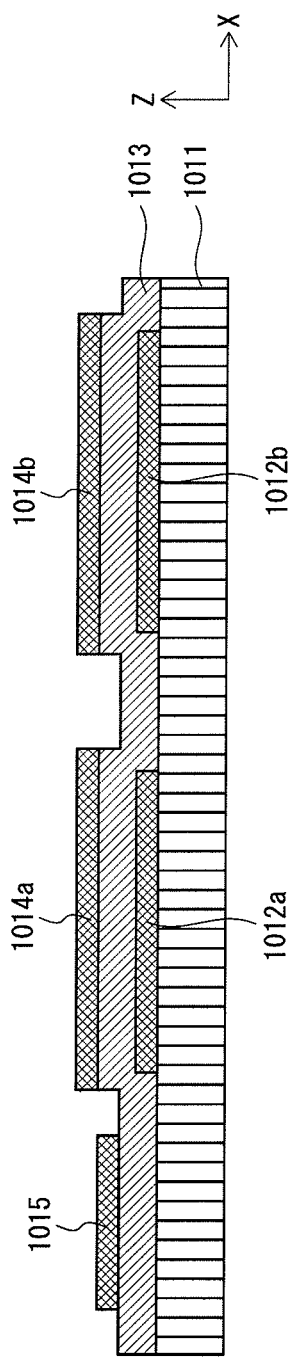
FIGS. 6A through 6C are schematic process diagrams illustrating procedures relating to the formation of partition walls 1016 among procedures involved in the manufacturing of the TFT substrate 101.

First, as shown in FIG. 6A, an intermediate member is prepared, which is composed of: the gate electrodes 1012a and 1012b; the insulating layer 1013; the source electrodes 1014a and 1014b; the drain electrodes 1014c and 1014d; and the connection wire 1015, which are formed on the substrate 1011. Note that the drain electrodes 1014c and 1014d are omitted from FIGS. 6A through 6C and FIGS. 7A and 7B.

Figure 6B:
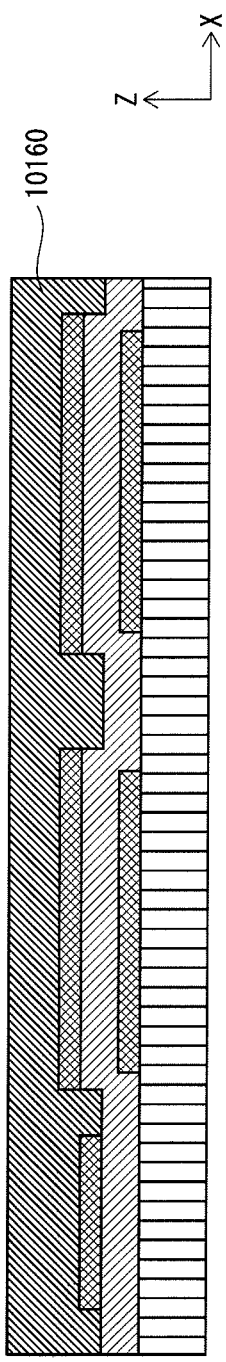

Next, as shown in FIG. 6B, a photoresist material film 10160 is deposited by a spin coating method or the like so as to cover the insulating layer 1013 and the electrodes 1014a through 1014d and 1015.

Figure 6C:
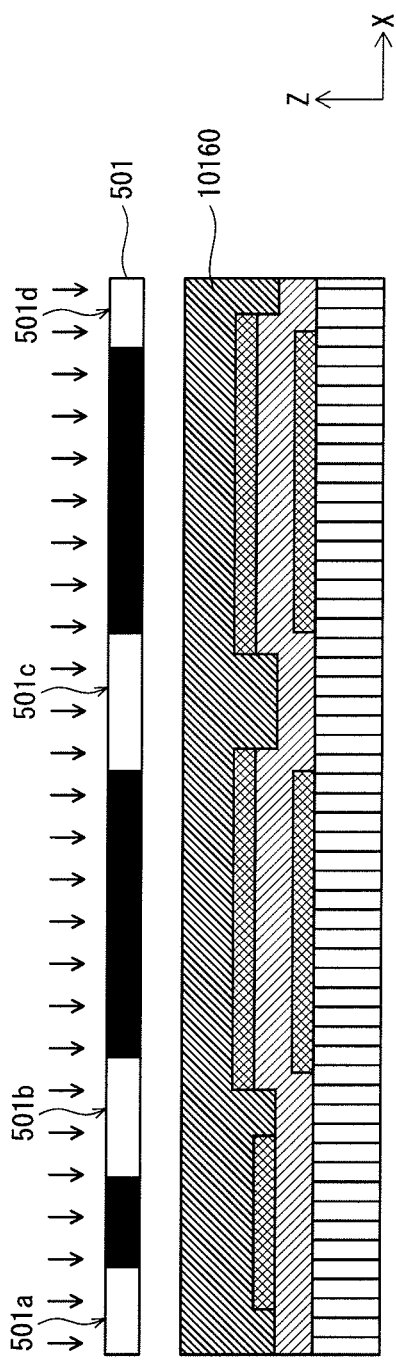

Subsequently, as shown in FIG. 6C, a mask 501 is placed above the photoresist material film 10160. The mask 501 has openings 501a through 501d at areas where the partition walls 1016 are to be formed. Exposure is performed through the openings 501a through 501d in the mask 501.

Subsequently, as shown in FIG. 7A, a mask 502 is placed above the photoresist material film 10161 which has undergone the first exposure. The mask 502 has openings 502a through 502d at areas where the steep-slope side face portions are to be formed. Exposure is performed for the second time through the openings 502a through 502d in the mask 502. Here, the steep-slope side face portions correspond to the side face portions 1061d and 1016g through 1016k shown in FIGS. 3A and 3B.

Next, by performing development and baking, the partition walls 1016 having the side face portions 1016e and 1016f with relatively gentle slopes and the side face portions 1016d and 1016g through 1016k with relatively steep slopes are formed as shown in FIG. 7B.

Embodiment 2

In the following, description is provided on a method of manufacturing an organic EL display panel pertaining to embodiment 2, with reference to FIG. 8. Note that the organic EL display panel pertaining to the present embodiment has the same structure as embodiment 1 described above. Also, the method of manufacturing an organic EL display panel is the same as embodiment 1 described above, except for the formation of the partition walls 1016 in the TFT substrate 101.

As shown in FIG. 8, a mask 503, which is a half-tone mask, is placed above the deposited photoresist material film 10160. The mask 503 has optical transmission sections 503a through 503h. Among them, the optical transmission sections 503a, 503d, 503f and 503h and the optical transmission sections 503b, 503c, 503e and 503g have different optical transmission rates. Specifically, the optical transmission sections 503b, 503c, 503e and 503g, which correspond to the steep-slope side face portions 1016d and 1016g through 1016k, have a higher optical transmission rate than the optical transmission sections 503a, 503d, 503f and 503h.

The mask 503 with the above-described structure is put in place, and after exposure and development, the partition walls 1016 shown in FIG. 3B are formed by baking. That is, the portions exposed to light through the optical transmission sections 503b, 503c, 503e and 503g with a high optical transmission rate, namely the side face portions 1016d and 1016g through 1016k, have steeper slopes than the portions exposed to light through the other optical transmission sections 503a, 503d, 503f and 503h, as represented by [Math. 1] through [Math. 6] above.

Note that subsequent processes are the same as embodiment 1 above.

The organic EL display device 1 pertaining to embodiment 1 above can be manufactured by the manufacturing method described above.

This manufacturing method can be used to form the side face portions 1016e and 1016f having relatively gentle slopes among the side face portions facing the apertures 1016b and 1016c, and can achieve the effects as described above.

Embodiment 3

Next, with reference to FIGS. 9A and 9B and FIGS. 10A and 10B, another embodiment of the manufacturing method of the organic EL display device 1 is described. FIGS. 9A and 9B and FIGS. 10A and 10B show processes corresponding to the processes shown from FIG. 6B to FIG. 7B.

As shown in FIG. 9A, first the photoresist material film 10160 is deposited, and then a mask 504 is placed above it. The mask 504 has openings 504a through 504d corresponding to the sections at which the banks 106 are to be formed.

After that, exposure and development for the first time is performed through the openings 504a through 504d of the mask 504. As a result, photoresist material films 10162 remain at the sections corresponding to the openings 504a through 504d as shown in FIG. 9B. Here, side face portions 10162d through 10162g, which faces apertures 10162a through 10162c defined by the photoresist material films 10162, have the same inclination angle, which is the same as the inclination angle of the side face portions 1016e and 1016f shown in FIGS. 3A and 3B.

According to the manufacturing method pertaining to the present embodiment, baking is not performed at this point of time.

Next, as shown in FIG. 10A, a mask 505 is placed above the photoresist material film 10162. The mask 505 has openings 505a through 505d corresponding to the sections at which steep-slope side face portions 1016d and 1016g through 1016k are to be formed.

After that, exposure and development for the second time is performed through the openings 505a through 505d of the mask 505. Then, baking is performed to form the partition walls 1016 as shown in FIG. 10B.

Subsequently, the organic EL display device 1 can be manufactured by performing the same processes as in the above embodiments 1 and 2 for example.

This manufacturing method can be used to form the side face portions 1016e and 1016f having relatively gentle slopes among the side face portions facing the apertures 1016b and 1016c, and can achieve the effects as described above.

Embodiment 4

In the following, description is provided on a structure of an organic EL display device pertaining to embodiment 4 of the present invention, with reference to FIG. 11. Note that the following only describes the structure of partition walls 3016 in the TFT substrate, which is the difference from embodiment 1.

As shown in FIG. 11, the partition walls 3016 in the TFT substrate pertaining to the present embodiment define three apertures, namely apertures 3016a through 3016c. Note that the entire TFT substrate has many apertures in addition to these three, but they are not depicted in the drawing.

The partition walls 3016 of the TFT substrate pertaining to the present embodiment are different from the partition walls pertaining to embodiment 1 in the shapes of the apertures 3016a through 3016c. Specifically, the apertures 3016a through 3016c pertaining to the present embodiment have rounded corners whereas the apertures 1016a through 1016c pertaining to embodiment 1 are rectangular. It is therefore difficult to clearly divide each of the side face portions facing the apertures 3016a through 3016c into plural sections.

Similarly to embodiment 1 described above, a connection wire 3015 for connection with an anode is located at the bottom portion of the aperture 3016a. In the apertures 3016b and 3016c, source electrodes 3014a and 3014b and drain electrodes 3014c and 3014d are disposed. Similarly to the apertures described above, the apertures 3016b and 3016c serve as channel portions when the organic semiconductor layer has been formed.

In the above-described structure, among the side face portions facing the apertures 3016b and 3016c, the areas 3016e and 3016f have a gentler slope than the other areas including the areas 3016d and 3016g.

With the stated structure, in the process of applying organic semiconductor ink included in the manufacturing of the TFT substrate pertaining to the present embodiment, the ink is surely prevented from overflowing into the aperture 3016a. Therefore, the TFT substrate having high quality can be manufactured, and accordingly an organic EL display panel and an organic EL display device including the TFT substrate have high quality.

Embodiment 5

In the following, description is provided on a structure of an organic EL display device pertaining to embodiment 5 of the present invention, with reference to FIG. 12. Note that the following only describes the structure of partition walls 4016 in the TFT substrate, which is the difference from embodiment 1.

Figure 12:
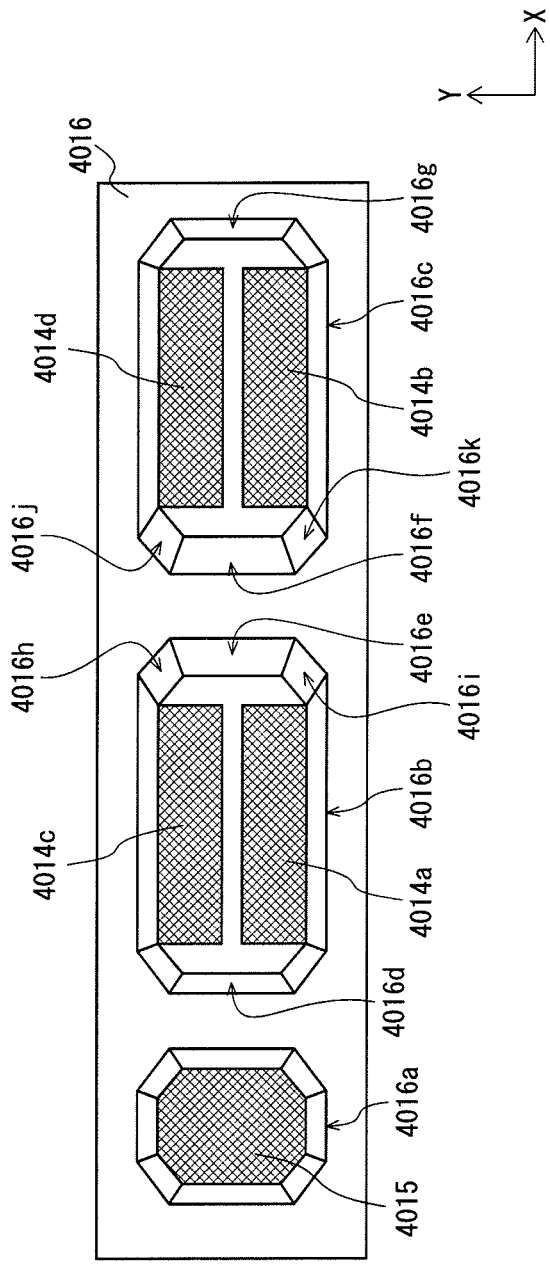
FIG. 12 is a schematic plan view illustrating, in a structure of an organic EL display panel pertaining to embodiment 5, a partial structure of partition walls 4016 of a TFT substrate.

As shown in FIG. 12, the partition walls 4016 in the TFT substrate pertaining to the present embodiment define three apertures, namely apertures 4016a through 4016c. Note that the entire TFT substrate has many apertures in addition to these three apertures, but they are not depicted in the drawing.

The partition walls 4016 of the TFT substrate pertaining to the present embodiment are different from the partition walls pertaining to embodiments 1 and 5 in the shapes of the apertures 4016a through 4016c. Specifically, the apertures 4016a through 4016c pertaining to the present embodiment are octagonal whereas the apertures 1016a through 1016c pertaining to embodiment 1 are rectangular and the apertures 3016a through 3016c pertaining to embodiment 5 have the shape of a rounded rectangle (with rounded corners).

Similarly to embodiment 1 described above, a connection wire 4015 for connection with an anode is located at the bottom portion of the aperture 4016a. In the apertures 4016b and 4016c, source electrodes 4014a and 4014b and drain electrodes 4014c and 4014d are disposed. Similarly to the apertures described above, the apertures 4016b and 4016c serve as channel portions when the organic semiconductor layer has been formed.

Note that the source electrodes 4014a and 4016b and the drain electrodes 4014c and 4014d are disposed to be entirely exposed at the bottom portions of the apertures 4016b and 4016c.

Among the side face portions facing the apertures 4016b and 4016c, the side face portions 4016e and 4016f have the gentlest slopes, and the side face portions 4016h, 4016i, 4016j and 4016k have the second gentlest slopes.

With the stated structure, in the process of applying organic semiconductor ink included in the manufacturing of the TFT substrate pertaining to the present embodiment, the ink is surely prevented from overflowing into the aperture 4016a. Therefore, the TFT substrate having high quality can be manufactured, and accordingly an organic EL display panel and an organic EL display device including the TFT substrate have high quality.

Since the inclination angle of the side face portions 4016h, 4016i, 4016j and 4016k is the intermediate value between the inclination angle of the side face portions 4016e and 4016f and the inclination angle of the side face portions 4016d, 4016g, . . . , the surface of the organic semiconductor layer is prevented from having an irregular shape.

[Other Matters]

In the above-described embodiments 1 through 5, description has been provided by taking as an example a TFT substrate to be used in the organic EL display panel 10. However, the TFT substrate may alternatively be used in a liquid crystal display panel, a field emission display panel, etc. Further, the TFT substrate may also be used in an electronic paper, etc.

In addition, the materials described in the above-described embodiments 1 through 5 are mere examples of such materials that may be used. As such, other materials may be used as necessary.

In addition, as illustrated in FIG. 2, the organic EL display panel 10 pertaining to embodiment 1 is a top-emission type organic EL display panel. However, the organic EL display panel may alternatively be a bottom-emission type organic EL display panel. In such a case, the materials to be used for forming the organic EL display panel and the layout design of the organic EL display panel may be changed as necessary.

Figure 13A:
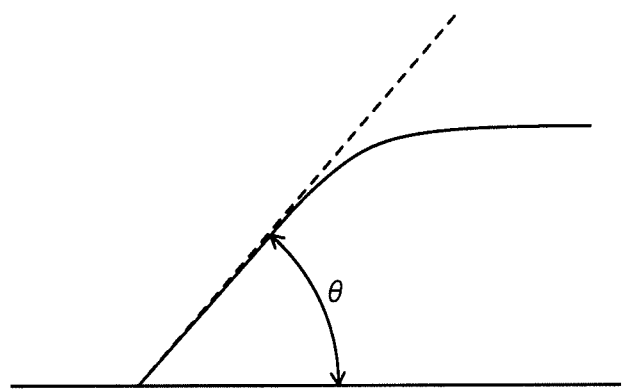
FIGS. 13A and 13B are schematic diagrams each showing the definition of the inclination angle of a side face portion facing an aperture in partition walls of a TFT substrate.
Figure 13B:
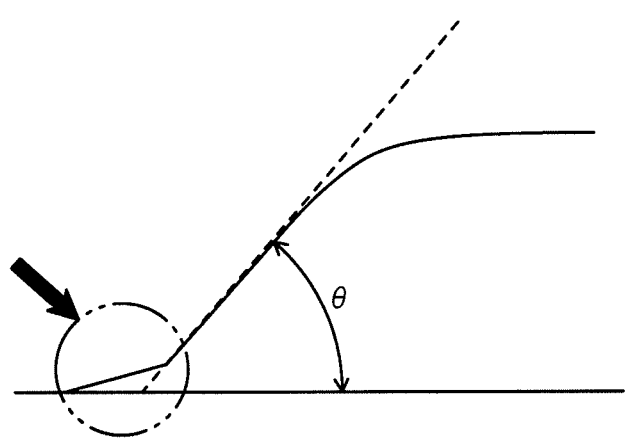

The definition of the inclination angles of the side face portions facing the apertures in the TFT substrate 101 for example is not provided in the above description. As shown in FIG. 13A, the inclination angle of a side face portion may be defined as angle θ formed by the side face portion and the main surface of the underlayer. When a side face portion has a rollover near the bottom portion of the aperture (the portion surrounded by the alternate long and two short dashes), it is possible to define the inclination angle of the side face portion by excluding the rollover from consideration.

Figure 14A:
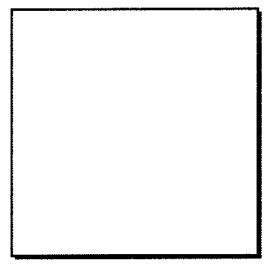
FIG. 14A is a schematic plan view illustrating a shape of an opening of an aperture defined by partition walls in a TFT substrate pertaining to modification 1.
Figure 14B:
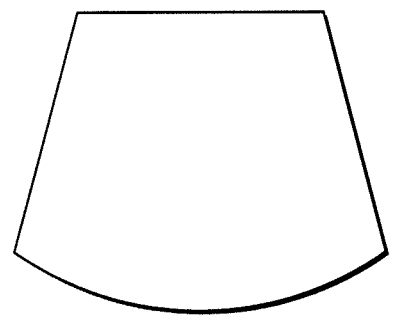
FIG. 14B is a schematic plan view illustrating a shape of an opening of an aperture defined by partitions wall in a TFT substrate pertaining to modification 2.
Figure 14C:
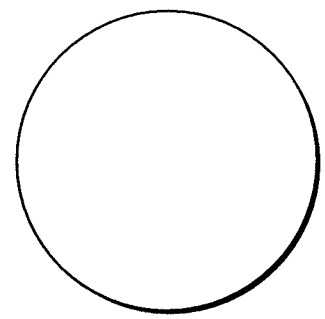
FIG. 14C is a schematic plan view illustrating a shape of an opening of an aperture defined by partition walls in a TFT substrate pertaining to modification 3.

In addition, in the above, four shapes have been described as examples of shapes of openings of the apertures defined by the partition walls. However, the apertures defined by the partition walls may alternatively have openings of various shapes. For instance, an aperture may have an opening having a square shape as illustrated in FIG. 14A, or may have an opening having a shape as illustrated in FIG. 14B composed of one side being a circular arc and three remaining sides being straight lines. Further, an aperture may have an opening having a circular shape or an oval shape as illustrated in FIG. 14C.

In addition, in the above, description has been provided that the outflow of organic semiconductor ink toward an aperture to come in contact with an anode or the like is undesirable, and thus should be prevented. However, the outflow of organic semiconductor ink to other types of apertures may alternatively be prevented. For instance, the outflow of organic semiconductor ink towards a "repair aperture" may be prevented. Here, the repair aperture refers to an aperture that is used when a defect is found in a TFT device having been formed and the TFT device is repaired by newly forming a TFT element only with respect to a cell having a defect.

Further, in cases such as where great stress is exerted on partition walls in a TFT substrate, holes may be formed in the partition walls in order to relieve the stress exerted on the partition walls. In such cases, it is desirable that configuration be made such that organic semiconductor ink is prevented from flowing out towards the holes formed in the partition walls in order to relieve the stress exerted on the partition walls. Note that, although the formation of organic semiconductor layers with respect to the above-described holes formed in the partition walls is not problematic by itself, a problem arises when organic semiconductor ink flow out towards such holes formed in the partition walls since the amount of organic semiconductor ink remaining at areas at which the formation of organic semiconductor layers is desired decreases. As such, the outflow of organic semiconductor ink towards the above-described holes is undesirable since the control of the layer thicknesses of the organic semiconductor layers would become difficult. In other words, the outflow of organic semiconductor ink towards such holes formed in the partition walls may affect TFT performance. As such, it is desirable that measures be taken so as to prevent organic semiconductor ink from flowing out towards the above-described holes formed in the partition walls in order to relieve the stress exerted on the partition walls.

In the above, description has been provided on a structure in which the outflow of organic semiconductor ink towards a specific aperture is undesirable, and thus prevented. However, application to a structure not including such an aperture is also possible. In specific, in a structure where two or more apertures with respect to which organic semiconductor layers are to be formed are arranged adjacent to each other, partition walls may be formed such that organic semiconductor ink does not flow out from one aperture towards another. By forming such partition walls, the formation of the organic semiconductor layers can be performed while it is ensured that organic semiconductor ink for forming one organic semiconductor layer exists separately from organic semiconductor ink for forming the other organic semiconductor layer. As such, compared to a case where the formation of organic semiconductor layers is performed while applied organic semiconductor ink covers two adjacent apertures and the gap therebetween, it is easier to reduce the difference between layer thickness of an organic semiconductor layer to be formed with respect to one aperture and layer thickness of another organic semiconductor layer to be formed with respect to an adjacent aperture, and as a result, excellent semiconductor characteristics and an improvement in yield can be expected.

INDUSTRIAL APPLICABILITY

The present disclosure is applicable to a display device provided with a display panel such as an organic EL display panel, and is useful for realizing a TFT element having high quality by realizing high-definition.

REFERENCE SIGNS LIST 1. organic EL display device
10. organic EL display panel
20. drive control circuit portion
21-24. drive circuit
25. control circuit
101. TFT substrate
102. planarizing film
102a. contact hole
103. anode
104. light-transmissive conduction film
105. hole injection layer
106. banks
107. hole transport layer
108. organic light-emitting layer
109. electron transport layer
110. cathode
111. sealing layer
112. adhesion layer
113. CF substrate
501, 502, 503, 504, 505. mask
1011, 1131. substrate
1012a, 1012b. gate electrode
1013. insulating layer
1014a, 1014b, 3014a, 3014b, 4014a, 4014b. source electrode
1014c, 1014d, 3014c, 3014d, 4014c, 4014d. drain electrode
1015, 3015, 4015. connection wire
1016, 3016, 4016. partition walls
1016a, 1016b, 1016c, 3016a, 3016b, 3016c, 4016a, 4016b, 4016c. aperture
1016d, 1016e, 1016f, 1016g, 1016h, 1016i, 1016j, 1016k, 3016d, 3016e, 3016f, 3016g, 4016d, 4016e, 4016f, 4016g. side face portion
1017a, 1017b. organic semiconductor layer
1018. passivation film
1132. color filter
1133. black matrix
10160, 10161, 10162. photoresist material film
10170, 10171. organic semiconductor ink

The invention claimed is:
1. A thin film transistor element comprising:
a gate electrode;
an insulating layer disposed on the gate electrode;
a source electrode and a drain electrode disposed on the insulating layer with a gap therebetween;
partition walls surrounding at least a part of the source electrode and at least a part of the drain electrode, the partition walls having liquid-repellant surfaces and defining a first aperture; and
an organic semiconductor layer disposed on the source electrode and the drain electrode within the first aperture so as to cover the source electrode and the drain electrode and fill the gap between the source electrode and the drain electrode, the organic semiconductor layer being in contact with the source electrode and the drain electrode, wherein the partition walls have side face portions facing of the first aperture, and some of the side face portions have gentler slopes than the rest of the side face portions.

2. The thin film transistor element of claim 1, wherein an inclination of each of the side face portions is defined as an angle thereof with respect to an upper surface of an underlayer on which the partition walls are provided.

3. The thin film transistor element of claim 1, wherein inclination angles of the gentler slopes of said some of the side face portions are smaller than inclination angles of the rest of the side face portions by 5 degrees or more.

4. An organic EL display element comprising:
the thin film transistor element of claim 1;
a planarizing film provided above the thin film transistor element and having a contact hole provided therein;
a lower electrode provided on the planarizing film so as to cover the planarizing film and a side surface of the planarizing film defining the contact hole, and electrically connected with one of the source electrode and the drain electrode;
an upper electrode provided above the lower electrode; and
an organic light-emitting layer interposed between the lower electrode and the upper electrode.

5. An organic EL display device comprising the organic EL display element of claim 4.

6. The thin film transistor element of claim 1, wherein the first aperture with the organic semiconductor layer provided inside the first aperture functions as a channel portion,
the partition walls define a second aperture with a gap between the first aperture and the second aperture, the second aperture not functioning as a channel portion, and
among the side face portions of the first aperture, said some of the side face portions having the gentler slopes do not include a side face portion that is adjacent to the second aperture.

7. The thin film transistor element of claim 6, wherein among the side face portions of the first aperture, said some of the side face portions having the gentler slopes are located opposite the side face portion that is adjacent to the second aperture with respect to the first aperture.

8. The thin film transistor element of claim 6, wherein at least a part of the source electrode, at least a part of the drain electrode, or a connection wire electrically connected with the source electrode or the drain electrode is provided at a bottom of the second aperture.

9. The thin film transistor element of claim 6, wherein among the side face portions of the first aperture, the side face portion that is adjacent to the second aperture has the steepest slope.

10. An organic EL display element comprising:
the thin film transistor element of claim 6;
a planarizing film provided above the thin film transistor element and having a contact hole provided therein;
a lower electrode provided on the planarizing film so as to cover the planarizing film and a side surface of the planarizing film defining the contact hole, and electrically connected with one of the source electrode and the drain electrode;
an upper electrode provided above the lower electrode; and
an organic light-emitting layer interposed between the lower electrode and the upper electrode, wherein
a bottom of the contact hole is in communication with the second aperture.

11. An organic EL display device comprising the organic EL display element of claim 10.

* * * * *